(12) United States Patent
Ikemoto et al.

(10) Patent No.: US 8,628,676 B2
(45) Date of Patent: Jan. 14, 2014

(54) PLASMA ETCHING METHOD

(75) Inventors: Naoya Ikemoto, Hyogo (JP); Takashi Yamamoto, Hyogo (JP); Yoshiyuki Nozawa, Hyogo (JP)

(73) Assignee: SPP Technologies Co., Ltd., Tokyo (JP)

( * ) Notice: Subject to any disclaimer, the term of this patent is extended or adjusted under 35 U.S.C. 154(b) by 0 days.

(21) Appl. No.: 13/638,144

(22) PCT Filed: May 25, 2011

(86) PCT No.: PCT/JP2011/062012
§ 371 (c)(1),
(2), (4) Date: Sep. 28, 2012

(87) PCT Pub. No.: WO2011/148985
PCT Pub. Date: Dec. 1, 2011

(65) Prior Publication Data
US 2013/0034961 A1    Feb. 7, 2013

(30) Foreign Application Priority Data
May 26, 2010  (JP) .................................. 2010-120288

(51) Int. Cl.
*H01L 21/3065* (2006.01)
(52) U.S. Cl.
USPC ....... 216/67; 438/695; 438/710; 257/E21.218
(58) Field of Classification Search
None
See application file for complete search history.

(56) References Cited

U.S. PATENT DOCUMENTS

| | | | | |
|---|---|---|---|---|
| 4,579,623 A | * | 4/1986 | Suzuki et al. ..................... | 438/7 |
| 5,015,330 A | * | 5/1991 | Okumura et al. .............. | 438/694 |
| 5,047,115 A | * | 9/1991 | Charlet et al. .................. | 216/64 |
| 5,458,734 A | * | 10/1995 | Tsukamoto ..................... | 438/701 |
| 5,522,966 A | * | 6/1996 | Komura et al. ................ | 438/701 |
| 6,303,513 B1 | * | 10/2001 | Khan et al. ..................... | 438/714 |
| 6,589,879 B2 | * | 7/2003 | Williams et al. ............... | 438/714 |
| 6,924,235 B2 | * | 8/2005 | Johnson et al. ............... | 438/689 |
| 2002/0151183 A1 | * | 10/2002 | Yang et al. ..................... | 438/714 |
| 2003/0003757 A1 | * | 1/2003 | Nallan et al. .................. | 438/710 |
| 2011/0207323 A1 | * | 8/2011 | Ditizio .......................... | 438/675 |

FOREIGN PATENT DOCUMENTS

| | | |
|---|---|---|
| JP | 2-089310 | 3/1990 |
| JP | 03-141640 | 6/1991 |
| JP | 11-111983 | 4/1999 |
| JP | 2003-277183 | 10/2003 |
| JP | 2006-173293 | 6/2006 |
| JP | 2007-141918 | 6/2007 |
| JP | 2007-266056 | 10/2007 |
| JP | 2009-259863 | 5/2009 |
| JP | 2010-021442 | 1/2010 |

\* cited by examiner

*Primary Examiner* — Allan Olsen
(74) *Attorney, Agent, or Firm* — Miller, Matthias & Hull LLP

(57) ABSTRACT

A plasma etching method capable of forming a tapering etching structure having a smooth surface is provided. A fluorine-containing gas and a nitrogen gas are used and plasma is generated from these gases simultaneously, and a silicon substrate K is etched by the plasma while an etch-resistant layer is formed on the silicon substrate K by the plasma and then a fluorine-containing gas and an oxygen-containing gas are used and plasma is generated from these gases simultaneously, and the silicon substrate K is etched by the plasma while an etch-resistant layer is formed on the silicon substrate K by the plasma generated from the oxygen-containing gas, thereby forming a tapering etching structure H having a wide top opening width and a narrow bottom width.

8 Claims, 25 Drawing Sheets

Fig. 9

| | step | process time (min) | chamber inner pressure (Pa) | power supplied to coil (W) | power supplied to platen (W) | SF₆ supply flow rate (sccm) | N₂ supply flow rate (sccm) | O₂ supply flow rate (sccm) | C₄F₈ supply flow rate (sccm) |
|---|---|---|---|---|---|---|---|---|---|
| Example 1 | first etching step | 0.08 | 12 | 2500 | 85 | 200 | 150 | — | — |
| | second etching step | 3 | 12 | 2500 | 85 | 200 | — | 150 | — |
| Example 2 | first etching step | 3 | 12 | 2500 | 85 | 200 | 150 | — | — |
| | second etching step | — | — | — | — | — | — | — | — |
| Comparative Example 1 | first etching step | 3.5 | 12 | 2500 | at beginning 85 →140 | 240 | — | 120 | 180 |
| | second etching step | 5.5 | 12 | 2500 | — | 200 | — | 150 | — |
| Comparative Example 2 | first etching step | 6.5 | 12 | 3500 | 100 | 180 | — | 80 | — |
| | second etching step | — | — | — | — | — | — | — | — |

Fig. 15

| etching process time (min) | chamber inner pressure (Pa) | platen temperature (°C) | power supplied to coil (W) | power supplied to platen (W) | SF$_6$ supply flow rate (sccm) | N$_2$ supply flow rate (sccm) | surface roughness (nm) | etching rate (μm/min) |
|---|---|---|---|---|---|---|---|---|
| 7 | 12 | 30 | 2500 | 50 | 300 | 50 | 154 | 16.2 |
| 7 | 12 | 30 | 2500 | 50 | 300 | 100 | 75 | 14.6 |
| 7 | 12 | 30 | 2500 | 50 | 300 | 200 | 71 | 12.3 |
| 7 | 12 | 30 | 2500 | 50 | 300 | 300 | 54 | 12.1 |
| 7 | 12 | 30 | 2500 | 50 | 300 | 400 | 60 | 12.7 |

Fig. 19

| etching process time (min) | chamber inner pressure (Pa) | platen temperature (°C) | power supplied to coil (W) | power supplied to platen (W) | SF₆ supply flow rate (sccm) | N₂ supply flow rate (sccm) | surface roughness (nm) | etching rate (μm/min) |
|---|---|---|---|---|---|---|---|---|
| 4 | 12 | 10 | 2500 | 10 | 200 | 300 | 44 | 10.1 |
| 4 | 16 | 10 | 2500 | 10 | 200 | 300 | 67 | 10.4 |
| 4 | 25 | 10 | 2500 | 10 | 200 | 300 | 83 | 10.9 |

Fig. 24

| etching process time (min) | chamber inner pressure (Pa) | platen temperature (°C) | power supplied to coil (W) | power supplied to platen (W) | SF$_6$ supply flow rate (sccm) | N$_2$ supply flow rate (sccm) | surface roughness (nm) | etching rate (μm/min) |
|---|---|---|---|---|---|---|---|---|
| 7 | 12 | 10 | 2500 | 30 | 200 | 300 | 76 | 18 |
| 7 | 12 | 10 | 2500 | 50 | 200 | 300 | 54 | 12.1 |
| 7 | 12 | 10 | 2500 | 70 | 200 | 300 | 54 | 12 |

PLASMA ETCHING METHOD

CROSS-REFERENCE TO RELATED APPLICATIONS

This application is a U.S. National Stage filing under 35 USC §371 of International Patent Application No. PCT/JP2011/062012 filed on May 25, 2011, which claims priority under the Paris Convention to Japanese Application No. 2010-120288, filed on May 26, 2010.

FIELD OF THE DISCLOSURE

The present invention relates to a plasma etching method in which plasma is generated from a predetermined processing gas to thereby etch a silicon substrate, thereby forming a tapering (gradually narrowing) etching structure (taper etching structure) having a wide top opening width and a narrow bottom width in the silicon substrate.

BACKGROUND OF THE DISCLOSURE

There are cases where an etching structure (hole or trench) formed by etching a silicon substrate is formed into a tapering shape with a wide top opening width and a narrow bottom width by forming the side wall thereof to be not vertical but inclined as shown in FIG. 3(b).

As an etching method of forming such a tapering etching structure in a silicon substrate, conventionally, a method disclosed in the Japanese Unexamined Patent Application Publication No. H2-89310 has been known, for example. This etching method is a method in which a gas mixture of hydrogen bromide and oxygen is used as an etching gas, and plasma is generated from this gas mixture to thereby etch a silicon substrate.

In this etching method, because an oxide film as an etch-resistant layer is formed on the silicon substrate by generating plasma from the oxygen gas and the silicon substrate is etched by generating plasma from the hydrogen bromide gas, the etching proceeds while the side wall of the etching structure is protected by the oxide film, and thereby the etching structure formed by the etching is formed into a tapering shape.

CITATION LIST

Patent Literature

Patent document 1: Japanese Unexamined Patent Application Publication No. 2-89310

SUMMARY OF THE DISCLOSURE

However, in protecting the side wall by means of an oxide film formed on the silicon substrate by generating plasma from an oxygen gas like the above conventional etching method, etching proceeds easily in the direction of the depth of the silicon substrate, while etching hardly proceeds in the direction of the width of the silicon substrate which is a direction forming an undercut in a portion just below the mask. Therefore, generating plasma from an oxygen gas is apt to cause such a shape that an upper portion of the side wall is hollowed out in an arc shape (bowing shape) (see FIG. 8), and therefore it is not possible to obtain a good etching shape.

Further, if an etching structure having a bowing shape is formed, for example, when deposition is performed using the CVD process after forming the tapering etching structure, the bowing shape is an obstacle to uniform deposition, and therefore a problem occurs that it is difficult to form a thin film on the portion of the bowing shape. Therefore, it is preferable to etch the silicon substrate to form an etching structure into a tapering shape in such a manner that a bowing shape is not formed.

It is noted that the etch-resistant layer can be also formed by generating plasma from a fluorocarbon gas such as C4F8 gas, for example, to form a polymer film. Therefore, for etching the silicon substrate, it is possible to use a fluorocarbon gas instead of the oxygen gas and use a polymer film formed by the fluorocarbon gas as the etch-resistant layer, or it is possible to use a fluorocarbon gas in addition to the oxygen gas and use the oxide film formed by the oxygen gas and a polymer film formed by the fluorocarbon gas as the etch-resistant layer.

However, when a polymer film is formed by generating plasma from a fluorocarbon gas, the surface of the side wall is apt to become in a rough state (a state where the surface roughness thereof is high) (see FIG. 6), and therefore it is not possible to obtain a highly accurate etching structure. This is considered to be caused by the fact that an etch-resistant layer formed by plasma generated from a fluorocarbon gas is a polymer film deposited on the surface of the silicon substrate and is difficult to form uniformly, unlike an oxide film formed on the surface of the silicon substrate by chemical reaction between plasma generated from an oxygen gas and the silicon atoms, for example. That is, portions where the polymer film is thin (portions where a small amount of polymer is deposited) are easily etched and portions where the polymer film is thick (portions where a large amount of polymer is deposited) are difficult to etch, and therefore unevenness occurs between the portions which are easily etched and the portions which are difficult to etch. It is known that such unevenness leads to a residue (micro mask), and therefore uniformity is caused in the etching state and the surface of the etched film becomes in a rough state (a state where the surface roughness thereof is high).

If the surface roughness is high, for example, when deposition is performed using the CVD process after forming the tapering etching structure, a problem occurs that it is not possible to form a thin film having an uniform film thickness. Therefore, it is preferable to etch the silicon substrate so that the surface roughness does not become high.

The present invention has been achieved in view of the above-described circumstances, and an object thereof is to provide a plasma etching method capable of preventing a bowing shape and forming a tapering etching structure having a smooth surface.

The present invention, for achieving the above-described object, relates to a plasma etching method in which plasma is generated from a processing gas and a silicon substrate is thereby etched to form a tapering hole or trench having a wide top opening width and a narrow bottom width in the silicon substrate, characterized in that a first step in which a fluorine-containing gas and a nitrogen gas are used as the processing gas and plasma is generated from these gases, and the silicon substrate is etched by the plasma generated from the fluorine-containing gas while an etch-resistant layer is formed on the silicon substrate by the plasma generated from the nitrogen gas is performed, and then a second step in which a fluorine-containing gas and an oxygen-containing has are used as the processing gas and plasma is generated from these gases, and the silicon substrate is etched by the plasma generated from the fluorine-containing gas while an etch-resistant layer is formed on the silicon substrate by the plasma generated from the oxygen-containing gas is performed. The generation of plasma from the fluorine-containing gas and the generation of plasma from the nitrogen gas can be performed simultaneously or sequentially.

According to the present invention, a fluorine-containing gas and a nitrogen gas are used as a processing gas and plasma is generated from these gases to etch a silicon substrate. Specifically, the silicon substrate is etched by generating plasma from the fluorine-containing gas while an etch-resistant layer (for example, a nitride film made of SiN) is formed on the silicon substrate by generating plasma from the nitrogen gas.

In a case where an etch-resistant layer is formed by plasma generated from a nitrogen gas, as compared with a case where an etch-resistant layer is formed by plasma generated from an oxygen gas, etching is performed easily in a direction forming an undercut in a portion just below a mask. Therefore, in a case where an etch-resistant layer is formed by plasma generated from a nitrogen gas, a bowing shape is hardly formed.

Further, in a case where an etch-resistant layer is formed by plasma generated from a nitrogen gas, unlike a polymer film deposited on the surface of the silicon substrate, the etch-resistant layer which is formed on the surface of the silicon substrate by chemical reaction between the plasma generated from the nitrogen gas and the silicon atoms hardly has a non-uniform layer thickness, and therefore the surface of an etching structure formed by etching has a small unevenness and is therefore smooth. Furthermore, generally, when using an etch-resistant layer formed by a nitrogen gas, the surface has a smaller unevenness and is smoother as compared with when using an etch-resistant layer formed by an oxygen gas.

In this way, a silicon substrate is etched to thereby form a tapering etching structure having a wide top opening width and a narrow bottom width in the silicon substrate.

Thus, according to the plasma etching method of the present invention, it is possible to form a tapering etching structure having a smooth surface without a bowing shape.

Further, in the above configuration, it is also preferable to adjust the supply flow rate of the nitrogen gas at the time of the etching and the pressure inside the chamber at the time of the etching to control a taper state of the etching structure formed. Here, the taper state of the etching structure includes the surface roughness thereof in addition to the shape of the taper formed.

It is noted that, in accordance with the JIS (Japanese Industrial Standards), the surface roughness is a concept which is represented by one or a combination of "the arithmetic mean roughness (Ra), the maximum height (Ry), the 10-point average roughness (Rz), the unevenness average distance (Sm), the average distance between local peaks (S) and the load length ratio (tp), which are parameters representing surface roughness, at portions extracted from the surface of an object in a random manner".

According to the above configuration, it is possible to simply and easily control the taper state by changing a process condition which is relatively easy to adjust. This makes it possible to form a tapering etching structure having a smooth surface without a bowing shape.

By the way, in a case where an etch-resistant layer is formed by plasma generated from a nitrogen gas, because the strength of the etch-resistant layer is low as compared with a case where an etch-resistant layer is formed by plasma generated from an oxygen gas, etching in the direction of the width of the etching structure proceeds easily and etching in the direction of the depth thereof hardly proceeds. Therefore, the etching speed in the direction of the depth of the etching structure is decreased and sometimes an etching speed over a certain level cannot be obtained.

Therefore, as described above, in such a case, it is advantageous to perform a first step which is a step in which plasma is generated from the fluorine-containing gas and the nitrogen gas and the silicon substrate is thereby etched, and then perform a second step in which a fluorine-containing gas and an oxygen-containing gas are used as the processing gas and plasma is generated from these gases, and the silicon substrate is etched by the plasma generated from the fluorine-containing gas while an etch-resistant layer is formed on the silicon substrate by the plasma generated from the oxygen-containing gas. The generation of plasma from the fluorine-containing gas and the generation of plasma from the oxygen-containing gas can be performed simultaneously or sequentially.

In this way, when the etch-resistant layer is formed by the plasma generated from the oxygen-containing gas, because the strength of the etch-resistant layer is high as compared with when the etch-resistant layer is formed by the plasma generated from the nitrogen gas, the etching proceeds more easily in the direction of the depth of the etching structure than in the direction of the width of the etching structure, which makes it possible to more efficiently perform the etching in the depth direction.

At this time, the side wall of the etching structure formed in the first step is protected by the etch-resistant layer formed by generating plasma from the nitrogen gas to thereby prevent the formation of a bowing shape, and the etching in the second step proceeds while a side wall which is newly generated by the etching in the second step is protected by the etch-resistant layer formed by generating plasma from the oxygen-containing gas (for example, an oxide film made of $SiO_2$). Further, because the etch-resistant layer is formed on the surface of the silicon substrate by chemical reaction between the plasma generated from the oxygen-containing gas and the silicon atoms, unlike a polymer film deposited on the surface of the silicon substrate, the etch-resistant layer hardly has a non-uniform layer thickness, and therefore the surface of the etching structure formed in the second step also has a small unevenness and is therefore smooth.

By performing etching in two steps in this way to, in the second step, further perform etching in the depth direction on the etching structure formed in the first step, as described above, it becomes possible to form a tapering etching structure having a smooth surface without a bowing shape, and further it becomes possible to obtain a higher etching speed. Therefore, it is possible to finish the etching in a shorter time even for an etching structure having a deep depth.

Further, in the first step in which the etch-resistant layer is formed by generating plasma from the nitrogen gas, because etching in the direction of the width of the etching structure proceeds easily as compared with the second step in which the etch-resistant layer is formed by generating plasma from the oxygen-containing gas, in a case where the first and second steps are performed successively, etching proceeds more in the direction of the width of the etching structure as a process time of the first step becomes longer. Thereby, a step frequently occurs at a boundary between the side wall of the etching structure formed in the first step and the side wall of the etching structure formed in the second step.

Therefore, it is preferable to set the process time of the first step equal to or longer than 4 seconds. This makes it possible to, in the first step, sufficiently perform the etching in the width direction and obtain a tapering etching structure which is prevented from having a bowing shape. Further, it is preferable to set the process time of the first step equal to or shorter than 10 seconds. This makes it possible to hold the etching in the direction of the width of the etching structure formed in the first step to a certain extent and prevent the occurrence of a step between the side wall of the etching structure formed in the first step and the side wall of the etching structure formed in the second step (even if a step occurs, it is a slight step).

It is noted that, for example, SF6 gas and CF4 gas can be given as the fluorine-containing gas and, for example, O2 gas can be given as the oxygen-containing gas.

As described above, according to the plasma etching method of the present invention, since, for forming a tapering hole or trench having a wide top opening width and a narrow bottom width in a silicon substrate, plasma is generated from a fluorine-containing gas and a nitrogen gas, and the silicon substrate is etched by the plasma generated from the fluorine-containing gas while an etch-resistant layer is formed on the silicon substrate by the plasma generated from the nitrogen gas, it is possible to form a tapering etching structure (taper etching structure) which is prevented from having a bowing shape and has a smooth surface.

BRIEF DESCRIPTION OF THE DRAWINGS

FIG. 9 is a table showing the experimental results of Examples 1 and 2 and Comparative Examples 1 and 2;

FIG. 15 is a table showing the experimental results of FIGS. 10 to 14;

FIG. 19 is a table showing the experimental results of FIGS. 16 to 18;

FIG. 24 is a table showing the experimental results of FIGS. 21 to 23.

DETAILED DESCRIPTION

1, Configuration of Apparatus

Hereinafter, a specific embodiment of the present invention will be described on the basis of the accompanying drawings.

Figure 1:
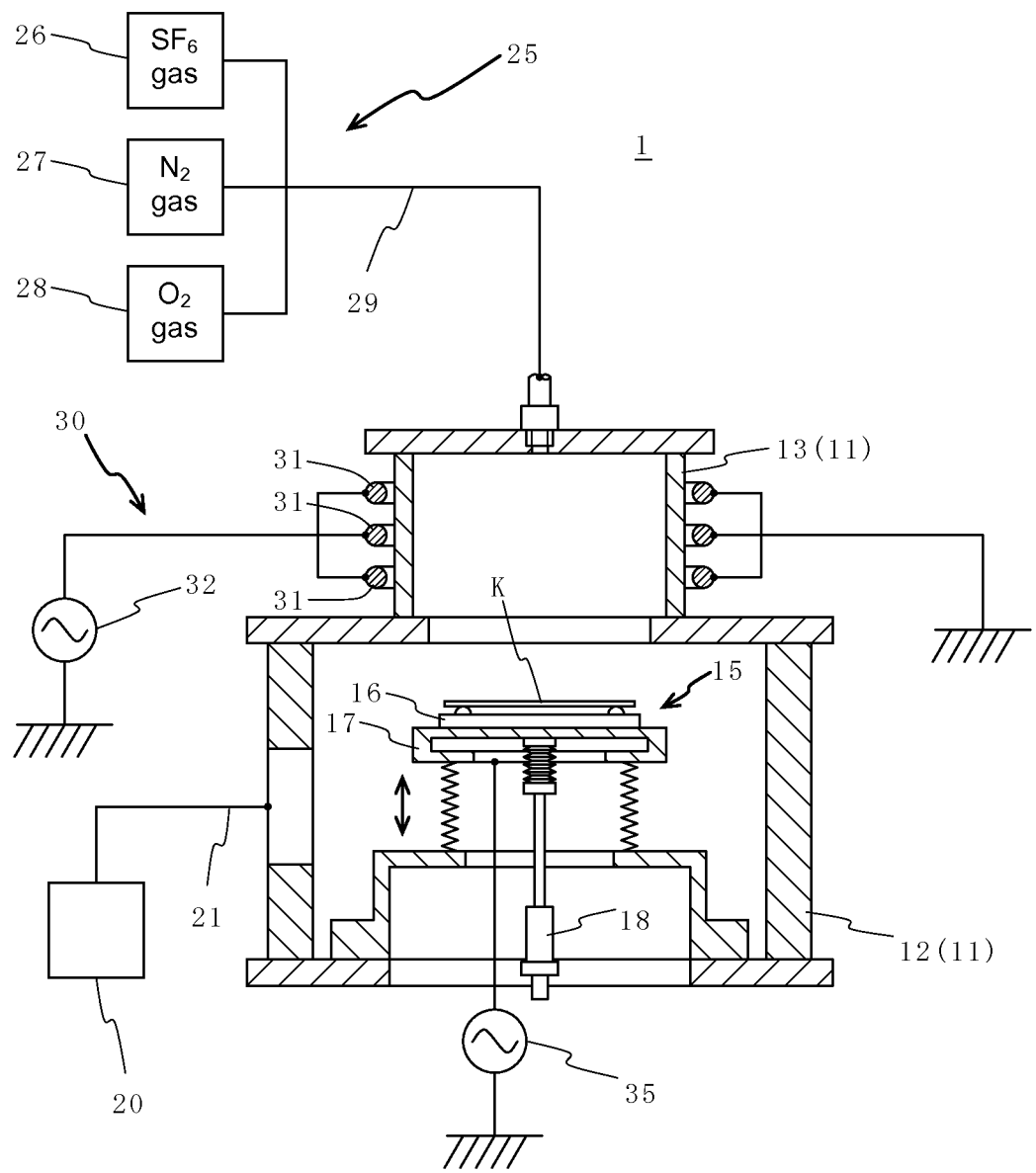
FIG. 1 is a sectional view showing a schematic configuration of an etching apparatus for performing a plasma etching method according to one embodiment of the present invention.

First of all, an etching apparatus 1 for performing a plasma etching method according to one embodiment of the present invention will be described on the basis of FIG. 1. As shown in FIG. 1, the etching apparatus 1 has a processing chamber 11 having a closed space, a platen 15 which is disposed in the processing chamber 11 to be movable up and down and on which a silicon substrate K is placed, a lifting cylinder 18 lifting up and down the platen 15, an exhaust device 20 reducing the pressure inside the processing chamber 11, a gas supply device 25 supplying a processing gas into the processing chamber 11, a plasma generating device 30 generating plasma from the processing gas supplied into the processing chamber 11, and a power supply unit 35 for supplying high-frequency or low-frequency power to the platen 15.

The processing chamber 11 comprises a lower chamber 12 and an upper chamber 13 which each have an inner space communicating with that of the other, and the upper chamber 13 is formed to be smaller than the lower chamber 12. The platen 15 comprises an upper member 16 on which the silicon substrate K is placed and a lower member 17 to which the lifting cylinder 18 is connected, and is disposed in the lower chamber 12.

The exhaust device 20 has an exhaust pipe 21 connected to a side surface of the lower chamber 12 and exhausts the gas within the processing chamber 11 through the exhaust pipe 21 to reduce the pressure inside the processing chamber 11 to a predetermined pressure.

The gas supply device 25 has a gas supply section 26 for supplying SF6 gas, a gas supply section 27 for supplying N2 gas, a gas supply section 28 for supplying O2 gas, and a supply pipe 29 one end of which is connected to the top surface of the upper chamber 13 and the other end of which is branched and is connected to the gas supply sections 26, 27, 28, and supplies SF6 gas, N2 gas and O2 gas into the processing chamber 11 from the gas supply sections 26, 27, 28 through the supply pipe 29, respectively.

The SF6 gas, N2 gas, O2 gas are each supplied into the processing chamber 11 as the processing gas, and a fluorine-containing gas such as CF4 gas, for example, may be supplied instead of SF6 gas.

The plasma generating device 30 comprises a plurality of annular coils 31 aligned vertically on the outer periphery of the upper chamber 13 and an RF power supply unit 32 for supplying radio-frequency power to the coils 31, and generates plasma from the SF6 gas, N2 gas and O2 gas supplied into the upper chamber 13 by causing the RF power supply unit 32 to supply radio-frequency power to the coils 31.

The power supply unit 35 supplies radio-frequency power to the platen 15 to produce a potential difference (bias potential) between the platen 15 and the plasma, thereby making ions which are generated by the generation of plasma from the SF6 gas incident on the silicon substrate K.

2, Formation of Etching Structure

Subsequently, a plasma etching method of forming a tapering etching structure having a wide top opening width and a narrow bottom width in the silicon substrate K using the etching apparatus 1 configured as described above is described.

First, a load-in step of loading the silicon substrate K into the etching apparatus 1 and placing the silicon substrate K onto the platen 15 is performed, and then a first etching step in which plasma is generated from a gas mixture of SF6 gas and N2 gas to thereby etch the silicon substrate K on the platen 15 is performed for a time period of between 4 and 10 seconds, for example.

In the first etching step, SF6 gas and N2 gas are supplied into the processing chamber 11 from the gas supply sections 26, 27, respectively, the pressure inside the processing chamber 11 is reduced to a predetermined pressure by the exhaust device 20, and radio-frequency power is supplied to the coils 31 and the platen 15 by the RF power supply units 32, 35, respectively. It is noted that a preferable supply flow rate of the N2 gas is 0.75 to 1 times as much as the supply flow rate of the SF6 gas, for example. Further, as obtained from the experimental results described later, in order to make the surface roughness of the taper etching structure good, it is preferable to set the supply flow rate of the N2 gas in a range of 100 to 400 sccm.

Plasma is generated from the SF6 gas and N2 gas supplied into the processing chamber 11, and the silicon substrate K is etched by the plasma generated from the SF6 gas and an etch-resistant layer is formed on the silicon substrate K by the plasma generated from the N2 gas. Further, as obtained from the experimental results described later, in order to make the surface roughness of the taper etching structure good, it is preferable to set the pressure inside the processing chamber 11 in a range of 12 Pa to 25 Pa.

Figure 2:
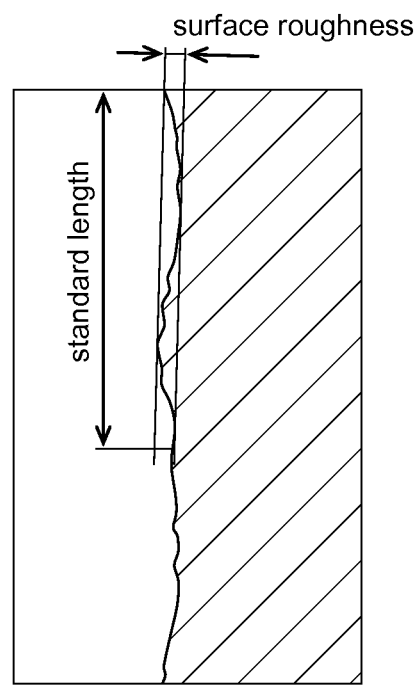
FIG. 2 is an illustration for explaining a method of measuring surface roughness in the embodiment.

In the Examples below, in the calculation of surface roughness, conforming to the maximum height Ry defined by the JIS, the evaluation is made by measuring the distance between the peak line and the valley line in an appropriate standard length on the basis of a microscope photograph of a section as shown in FIG. 2. It is noted that the "surface roughness" in the claims is not limited to that determined by the evaluation method used in the Examples, it is possible to employ an arbitrary method which conforms to the above-mentioned JIS.

Specifically, the silicon substrate K is etched by chemical reaction between radicals generated from the SF6 gas and the silicon atoms and by incidence of ions generated from the SF6 gas due to the bias potential on the silicon substrate K, and a nitride film made of SiN, for example, is formed on the surface of the silicon substrate K as an etch-resistant layer by chemical reaction between ions generated from the N2 gas and the silicon atoms. In this way, the etching of the silicon substrate K and the formation of the etch-resistant layer proceed simultaneously, and the silicon substrate K is etched while being protected by the etch-resistant layer.

Here, in a case where an etch-resistant layer is formed by plasma generated from N2 gas, because the strength of the etch-resistant layer is low as compared with a case where an etch-resistant layer is formed by plasma generated from O2 gas, etching is easily performed in a direction forming an undercut in a portion just below a mask. As a result thereof, a bowing shape is hardly formed and it is easy to obtain a taper etching structure having a good shape.

Further, since the etch-resistant layer is formed by the chemical reaction between the plasma generated from the N2 gas and the silicon atoms, unlike a polymer film deposited on the surface of the silicon substrate K, the etch-resistant layer hardly has a non-uniform layer thickness, and thereby the surface of the etching structure formed by the etching has a small unevenness and is therefore smooth.

Figure 3:
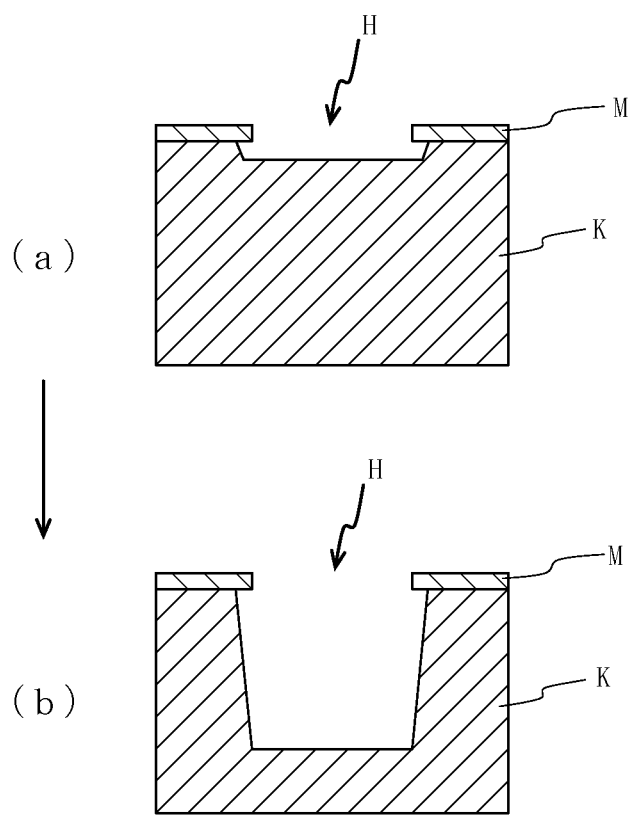
FIG. 3 is a sectional view for explaining the plasma etching method according to the embodiment.

Further, when the first etching step has been finished, the silicon substrate K has a shape as shown in FIG. 3(a), for example. It is noted that in FIG. 3(a) the reference M indicates a mask and the reference H indicates the etching structure.

Thereafter, a second etching step in which plasma is generated from a gas mixture of SF6 gas and O2 gas to thereby etch the silicon substrate K on the platen 15 is performed, and in this second etching step etching is further performed in the depth direction on the etching structure formed in the first etching step.

In the second etching step, SF6 gas and O2 gas are supplied into the processing chamber 11 from the gas supply sections 26, 28, respectively, the pressure inside the processing chamber 11 is reduced to a predetermined pressure by the exhaust device 20, and radio-frequency power is supplied to the coils 31 and the platen 15 by the RF power supply units 32, 35, respectively. It is noted that a preferable supply flow rate of the O2 gas is 0.75 to 1 times as much as the supply flow rate of the SF6 gas, for example.

Plasma is generated from the SF6 gas and O2 gas supplied into the processing chamber 11, and the silicon substrate K is etched by the plasma generated from the SF6 gas and an etch-resistant layer is formed on the silicon substrate K by the plasma generated from the O2 gas.

Specifically, as described above, the silicon substrate K is etched by chemical reaction between radicals generated from the SF6 gas and the silicon atoms and by incidence of ions generated from the SF6 gas due to the bias potential on the silicon substrate K, and an oxide film made of SiO2, for example, is formed on the surface of the silicon substrate K as an etch-resistant layer by chemical reaction between ions generated from the O2 gas and the silicon atoms. Thus, also in the second etching step, the etching of the silicon substrate K and the formation of the etch-resistant layer proceed simultaneously, and the silicon substrate K is etched while being protected by the etch-resistant layer.

The reason for using O2 gas instead of N2 gas in the second etching step is as follows. That is, in a case where an etch-resistant layer is formed by plasma generated from N2 gas, as compared with a case where an etch-resistant layer is formed by plasma generated from O2 gas, etching in the direction of the width of the etching structure easily proceeds, while etching in the direction of the depth of the etching structure hardly proceeds. Therefore, the etching speed in the direction of the depth of the etching structure is low and sometimes an etching speed over a certain level cannot be obtained.

Therefore, using O2 gas makes it possible to more efficiently perform etching in the depth direction. At this time, the side wall of the etching structure formed in the first etching step has already been protected by the etch-resistant layer formed by the generation of plasma from the N2 gas and prevented from having a bowing shape.

Further, the etching is performed while a side wall which is newly formed by the etching in the second etching step is protected by the etch-resistant layer formed by the generation of plasma from the O2 gas. Furthermore, since the etch-resistant layer is formed on the surface of the silicon substrate K by the chemical reaction between the plasma generated from the O2 gas and the silicon atoms, unlike a polymer film deposited on the surface of the silicon substrate K, the etch-resistant layer hardly has a non-uniform layer thickness, and thereby the surface of the etching structure formed in the second etching step also has a small unevenness and is therefore smooth.

When the second etching step has been finished, the silicon substrate K has a shape as shown in FIG. 3(b), for example. It is noted that in FIG. 3(b) the reference M indicates a mask and the reference H indicates the etching structure.

When the first etching step and the second etching step have been performed successively in this way, thereby forming a tapering etching structure having a wide top opening width and a narrow bottom width in the silicon substrate K, a load-out step of loading out the silicon substrate K is performed.

Thus, according to the plasma etching method of the embodiment, for forming a tapering etching structure having a wide top opening width and a narrow bottom width in a silicon substrate K, the first etching step of etching the silicon substrate K by generating plasma from a gas mixture of SF6 gas and N2 gas and the second etching step of etching the silicon substrate K by generating plasma from a gas mixture of SF6 gas and O2 gas are performed successively. Therefore, it is possible to form a tapering etching structure having a smooth surface without a bowing shape.

Further, since etching can be performed at a high etching speed in the direction of the depth of the etching structure in the second etching step, it is possible to finish the etching in a shorter time even for an etching structure having a deep depth.

Figure 4:
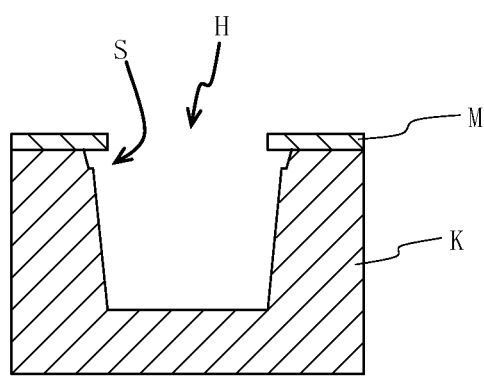
FIG. 4 is an illustration for explaining a problem occurring when the process time of the first etching step is long.

Further, since the process time of the first etching step is set in a range of 4 to 10 seconds, it is possible to prevent the process time of the first etching step from becoming long. The reason therefor is that, because, in the first etching step in which the etch-resistant layer is formed by generating plasma from the N2 gas, etching in the direction of the depth of the etching structure H hardy proceeds and etching in the direction of the width of the etching structure H easily proceeds as compared with the second etching step in which the etch-resistant layer is formed by generating plasma from the O2 gas, the etching in the direction of the width of the etching structure H proceeds more as the process time of the first etching step becomes longer, which causes a problem that a step S frequently occurs at a boundary between the side wall of the etching structure H formed in the first etching step and the side wall of the etching structure H formed in the second etching step (see FIG. 4). Therefore, with the above configuration, it is possible to hold the etching in the direction of the width of the etching structure H to a certain extent to thereby prevent the occurrence of a step S (even if a step S occurs, it is a slight step).

Figure 5A:
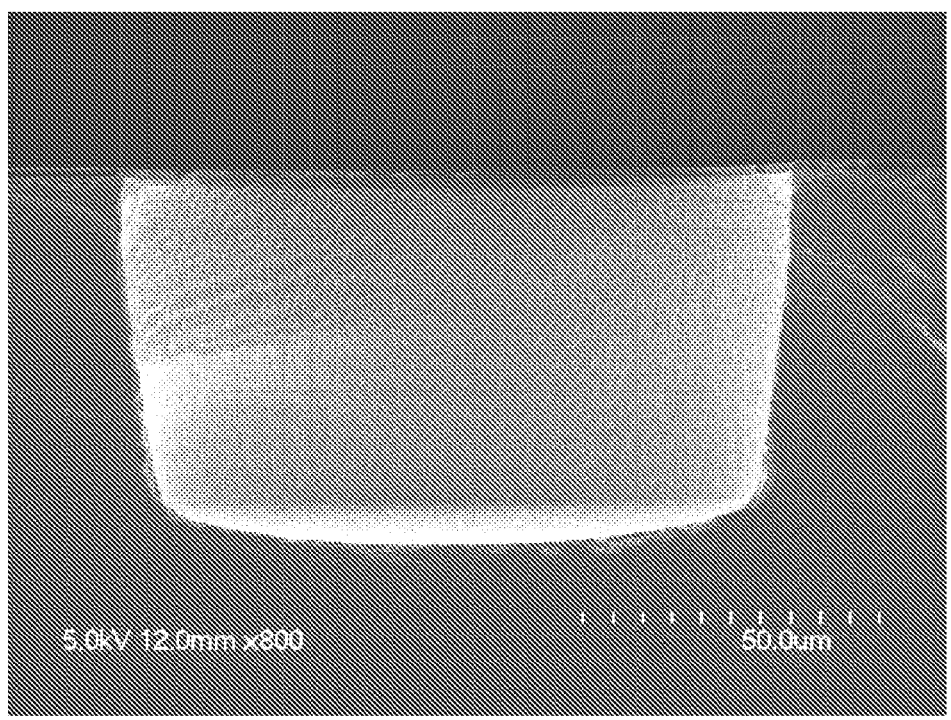
FIG. 5(a) is a microscope photograph showing the entire section of a taper etching structure according to Example 1.
Figure 5B:
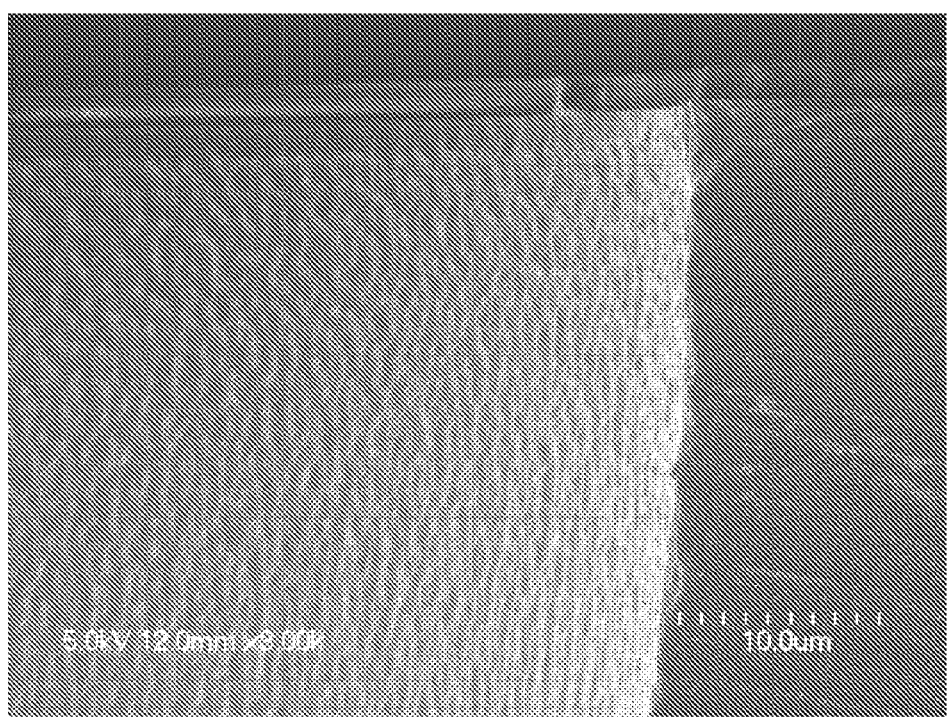
FIG. 5(b) is a microscope photograph showing an upper portion of the taper etching structure according to Example 1.
Figure 5C:
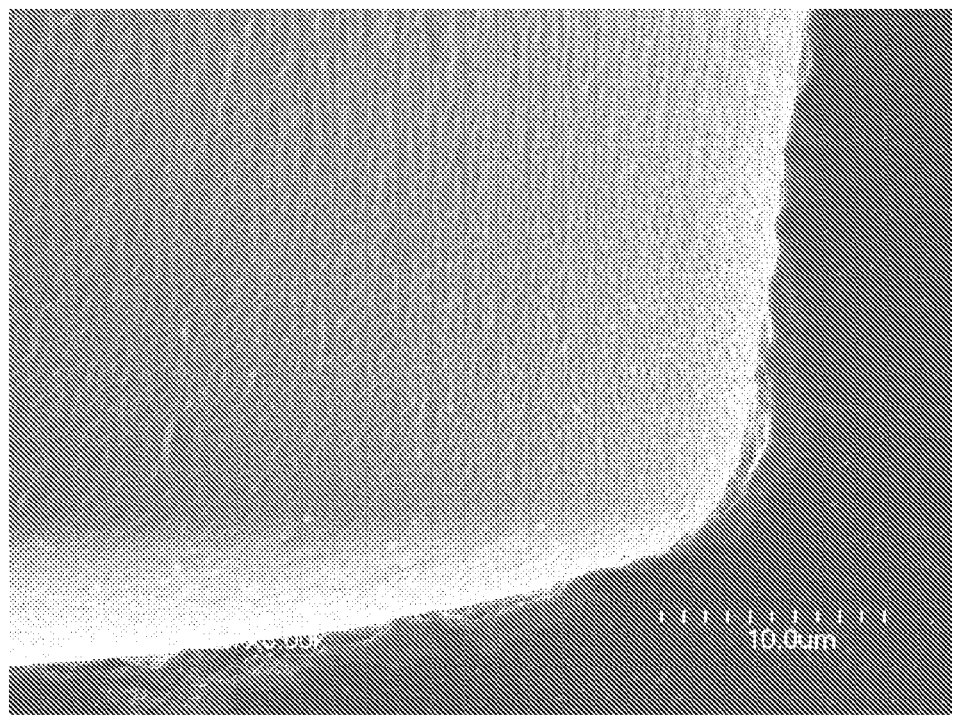
FIG. 5(c) is a microscope photograph showing a bottom portion of the taper etching structure according to Example 1.

In this connection, when, as Example 1, a silicon substrate K was etched using the plasma etching method according to this embodiment to thereby form a tapering hole having a wide top opening width and a narrow bottom width in the silicon substrate K, a taper etching structure which had no bowing shape formed therein and the surface of which was not rough but smooth as shown in the microscope photograph of FIG. 5 was formed. Specifically, the surface roughness of the side wall thereof was 0.15 μm and the taper angle thereof was 84°. It is noted that the processing conditions of the first etching step were as follows: the process time was 0.08 minutes; the pressure inside the processing chamber 11 was 12 Pa; the radio-frequency power supplied to the coils 31 was 2500 W; the power supplied to the platen 15 was 85 W; the supply flow rate of the SF6 gas was 200 sccm; and the supply flow rate of the N2 gas was 150 sccm, and the processing conditions of the second etching step were as follows: the process time was 3 minutes; the pressure inside the processing chamber 11 was 12 Pa; the radio-frequency power supplied to the coils 31 was 2500 W; the power supplied to the platen 15 was 85 W; the supply flow rate of the SF6 gas was 200 sccm; and the supply flow rate of the O2 gas was 150 sccm. Further, FIG. 5(a) is a microscope photograph showing the entire section of the formed etching structure, FIG. 5(b) is a microscope photograph in which an upper portion of the formed etching structure is enlarged, and FIG. 5(c) is a microscope photograph in which a bottom portion of the formed etching structure is enlarged.

Figure 6A:
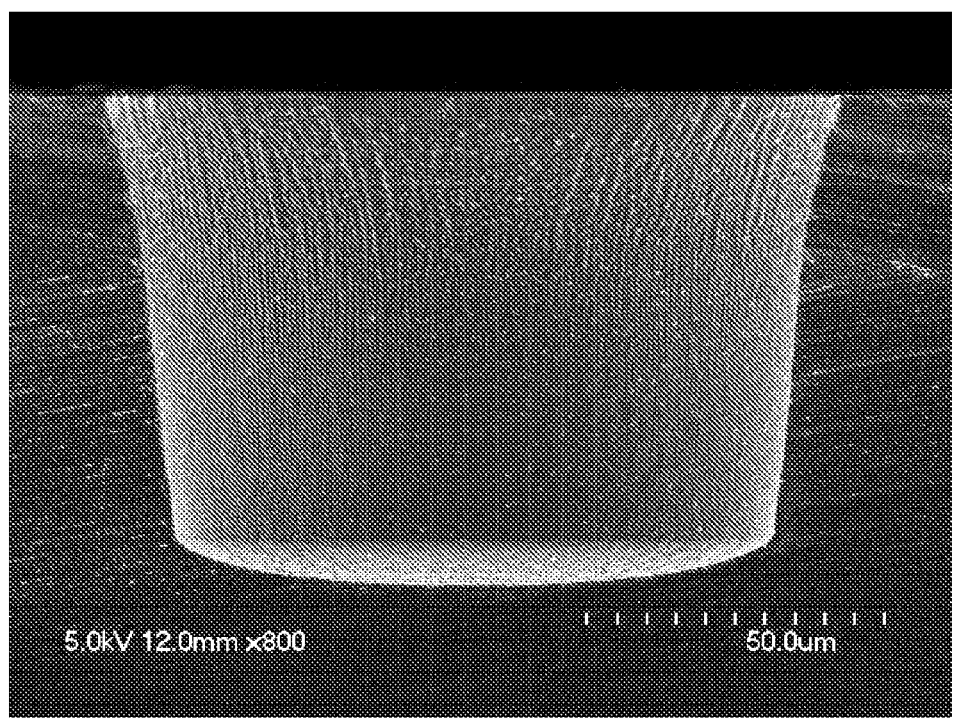
FIG. 6(a) is a microscope photograph showing the entire section of a taper etching structure according to Comparative Example 1.
Figure 6B:
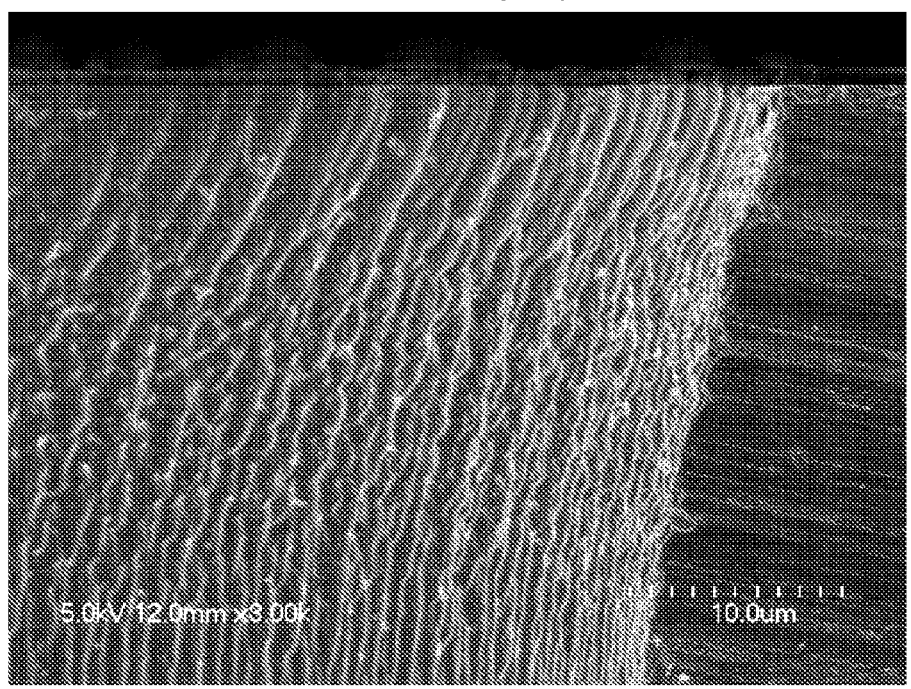
FIG. 6(b) is a microscope photograph showing the entire section of the taper etching structure according to Comparative Example 1.
Figure 6C:
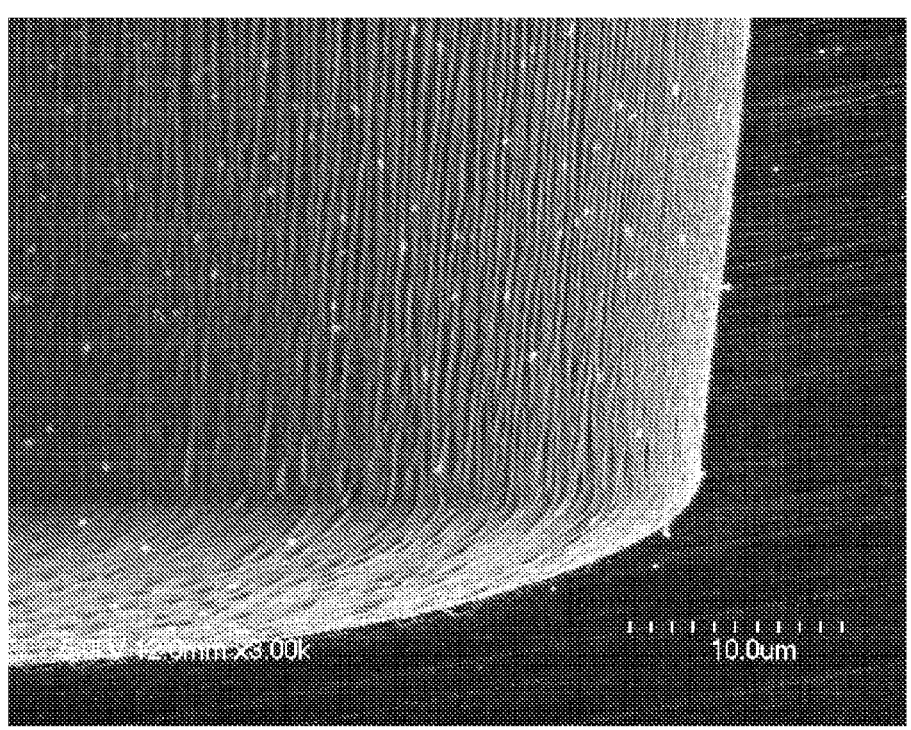
FIG. 6(c) is a microscope photograph showing the entire section of the taper etching structure according to Comparative Example 1.

Further, when, as Comparative Example 1, the first etching step having the processing conditions that: the process time was 3.5 minutes; the pressure inside the processing chamber 11 was 12 Pa; the radio-frequency power supplied to the coils 31 was 2500 W; the power supplied to the platen 15 was 15 W; the supply flow rate of the SF6 gas was 240 sccm; the supply flow rate of the O2 gas is 120 sccm; and the supply flow rate of the C4F8 gas was 180 sccm, and the second etching step having the processing conditions that: the process time was 5.5 minutes; the pressure inside the processing chamber 11 was 12 Pa; the radio-frequency power supplied to the coils 31 was 2500 W; the power supplied to the platen 15 was 85 to 140 W; the supply flow rate of the SF6 gas was 200 sccm; and the supply flow rate of the O2 gas was 150 sccm were performed successively, a hole having a rough surface at the opening (upper portion) thereof was formed as shown in FIG. 6. Specifically, the surface roughness of an upper portion of the side wall thereof was 0.3 µm. It is noted that FIG. 6(a) is a microscope photograph showing the entire section of the formed etching structure, FIG. 6(b) is a microscope photograph in which an upper portion of the formed etching structure is enlarged, and FIG. 6(c) is a microscope photograph in which a bottom portion of the formed etching structure is enlarged.

Figure 7:
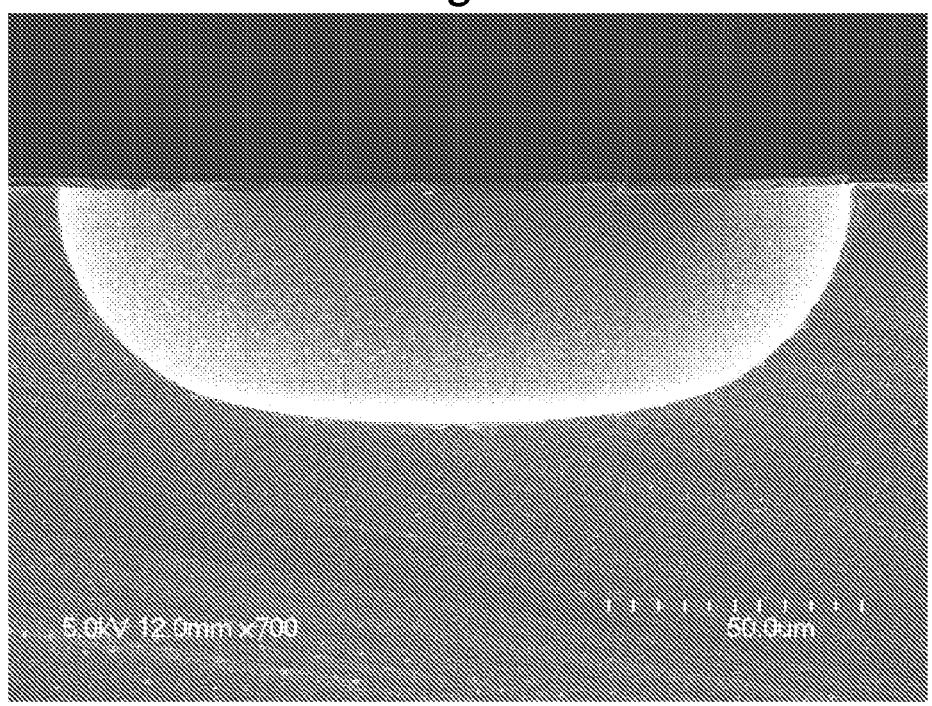
FIG. 7 is a microscope photograph showing a section of a taper etching structure according to Example 2.

Further, when, as Example 2, a silicon substrate K was etched under the processing conditions that: the process time was 3 minutes; the pressure inside the processing chamber 11 was 12 Pa; the radio-frequency power supplied to the coils 31 was 2500 W; the power supplied to the platen 15 was 85 W; the supply flow rate of the SF6 gas is 200 sccm; and the supply flow rate of the N2 gas is 150 sccm, a hole the surface of which is not rough but smooth was formed as shown in the microscope photograph of FIG. 7.

Figure 8:
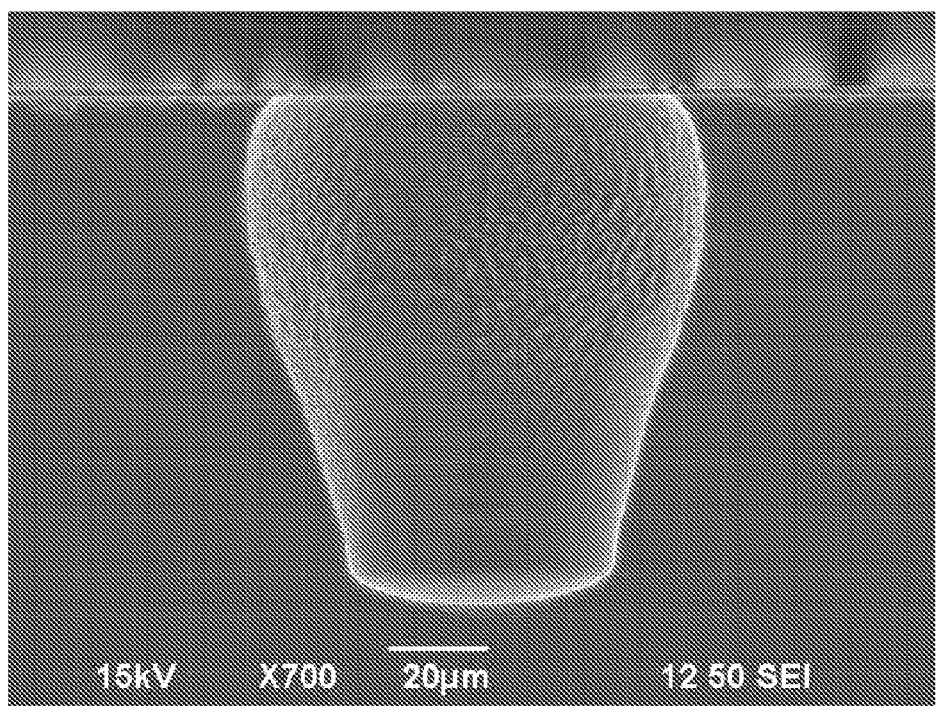
FIG. 8 is a microscope photograph showing a section of an etching structure according to Comparative Example 2.

On the other hand, when, as Comparative Example 2, a silicon substrate K was etched under the processing conditions that: the process time was 6.5 minutes; the pressure inside the processing chamber 11 was 12 Pa; the radio-frequency power supplied to the coils 31 was 3500 W; the power supplied to the platen 15 was 100 W; the supply flow rate of the SF6 gas is 180 sccm; and the supply flow rate of the O2 gas is 80 sccm, a bowing shape was formed on the side wall of the hole as shown in the microscope photograph of FIG. 8.

As seen from the Comparative Example 1, when the side wall was protected by the etch-resistant layer formed by generating plasma from the C4F8 gas, the side wall surface of the etching structure (the surface of a upper side wall of the hole) formed in the first etching step using C4F8 gas was rough. As seen from the Comparative Example 2, when the side wall was protected by the etch-resistant layer formed by generating plasma from the O2 gas from the beginning, a bowing shape was formed.

On the other hand, as seen from the Examples 1 and 2, when the side wall is protected by an etch-resistant layer formed by generating plasma from N2 gas, it is possible to form a taper etching structure having a smooth surface without a bowing shape (the taper includes all gradually narrowing shapes, such as a bowl shape, as long as it has a wide top opening width and a narrow bottom width). Further, from the Example 2, it is seen that protecting the side wall by means of an etch-resistant layer formed by generating plasma from N2 gas makes it possible to form an etching structure having a smooth surface.

From the Examples 1 and 2 and the Comparative Examples 1 and 2, it is obvious that when the side wall is protected by an etch-resistant layer formed by generating plasma from N2 gas, a taper etching structure which has no bowing shape formed therein and the surface of which is not rough but smooth is formed. For convenience in reference, a table of conditions of the Examples 1 and 2 and the Comparative Examples 1 and 2 is provided as FIG. 9.

3, Adjustment of Process Condition in N2 Gas Etching

In the above, a method in which a taper etching structure having a smooth surface without a bowing shape can be formed by protecting the side wall thereof by means of an etch-resistant layer formed by generating plasma from N2 gas is described. However, as a result of further earnest consideration, the inventors, by an experiment, found that the state of the formed taper etching structure (including the shape and the surface roughness thereof) was greatly changed also depending on the flow rate of the N2 gas and the pressure inside the reaction chamber. This means that adjusting these process conditions at the time of the etching using N2 gas made it possible to control the taper state. Hereinafter, the results of the experiment will be described.

3-1, Third Example

First, as Example 3, the inventors carried out an experiment on how the taper state was changed by changing the amount of the N2 supplied at the time of N2 gas etching.

FIGS. 10 to 14 are microscope photographs showing how the state of the etching structure was changed when the flow rate of N2 gas was gradually increased without changing other process conditions. The (b)s of FIGS. 10 to 14 are microscope photographs in which a side wall portion of their respective (a)s is enlarged, and the state of the roughness of the surface thereof is relatively easily seen from them. The common process conditions of FIGS. 10 to 14 were as follows: the etching process time was 7 minutes; the pressure inside the processing chamber 11 was 12 Pa; the platen temperature was 10° C.; the radio-frequency power supplied to the coils 31 was 2500 W; the power supplied to the platen 15 was 50 W; and the supply flow rate of SF6 gas was 300 sccm. Further, the inventors changed the supply flow rate of N2 gas within a range of 50 to 400 sccm.

Figure 10A:
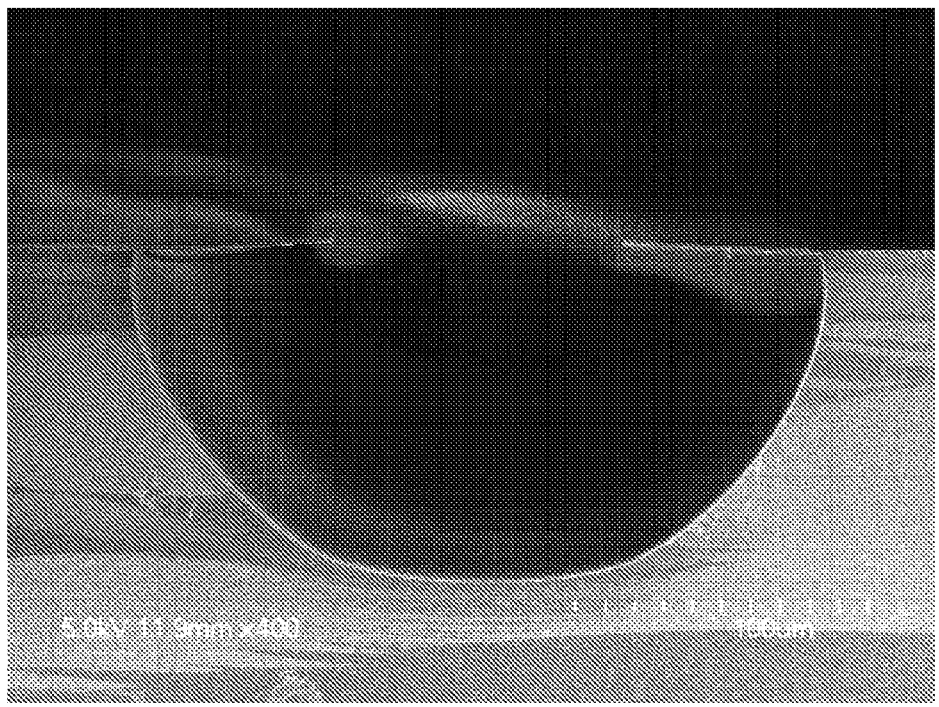
FIG. 10(a) is a microscope photograph showing the entire section of a taper etching structure in an experiment in which the flow rate of the supplied nitrogen gas is changed.
Figure 10B:
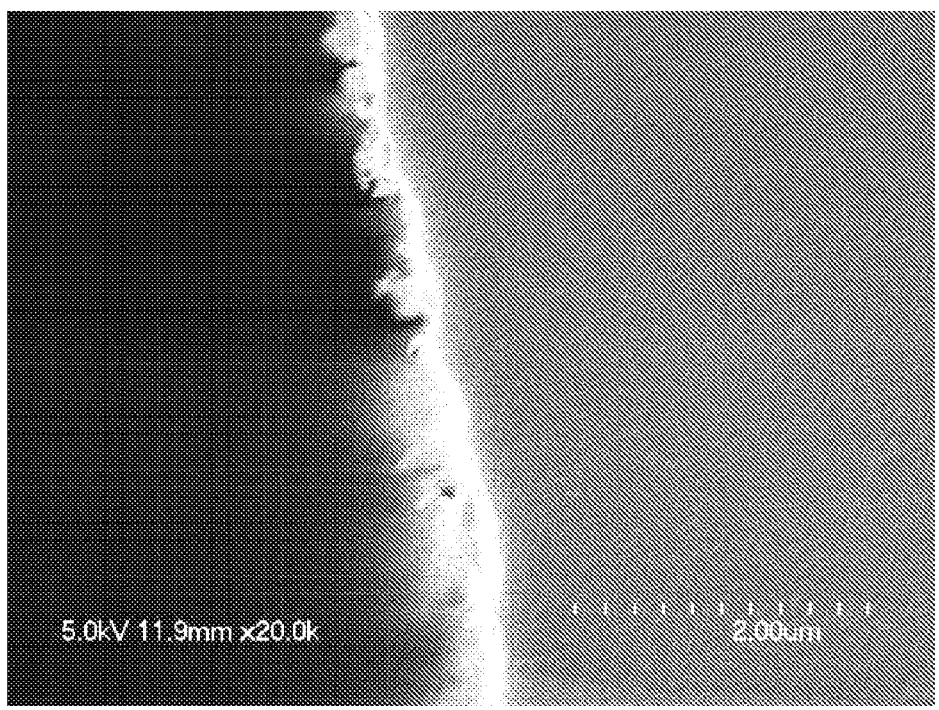
FIG. 10(b) is a microscope photograph in which an upper side surface of the taper etching structure of FIG. 10(a) is enlarged.

FIG. 10(a) is a microscope photograph showing the entire section of an etching structure formed when the supply flow rate of N2 gas was 50 sccm, and FIG. 10(b) is a microscope photograph in which a side wall of the formed etching structure is enlarged. From the state shown in FIG. 10(b), it can be read that the surface of a side portion of the etching structure is rough. The measurement result of the surface roughness in this figure was 154 nm, and the etching rate was 16.2 µm/min.

Figure 11A:
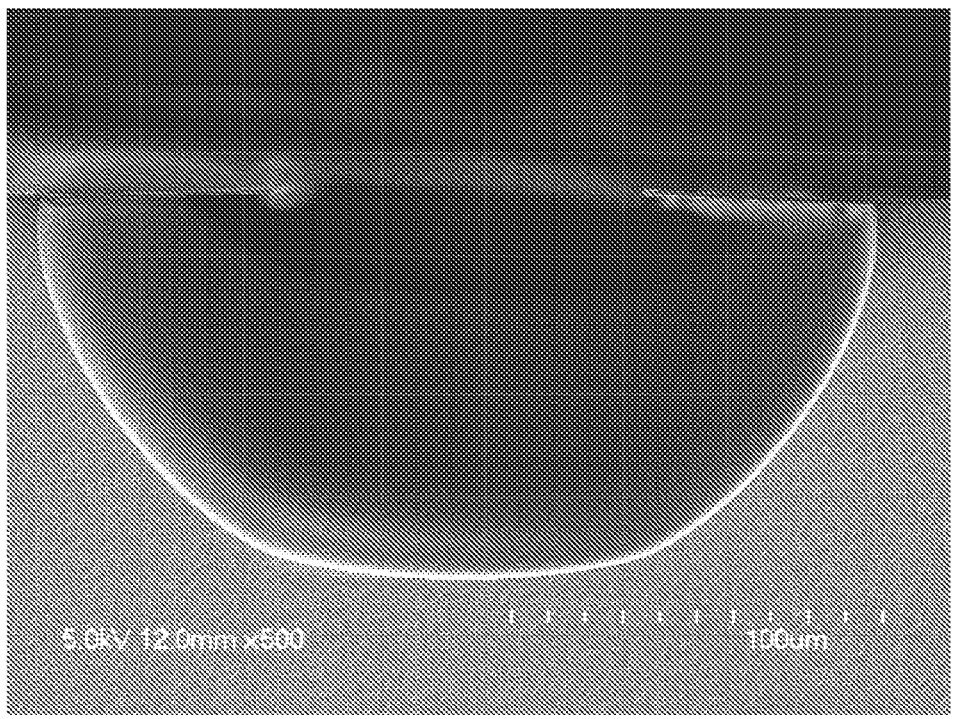
FIG. 11(a) is a microscope photograph showing the entire section of a taper etching structure in the experiment in which the flow rate of the supplied nitrogen gas is changed.
Figure 11B:
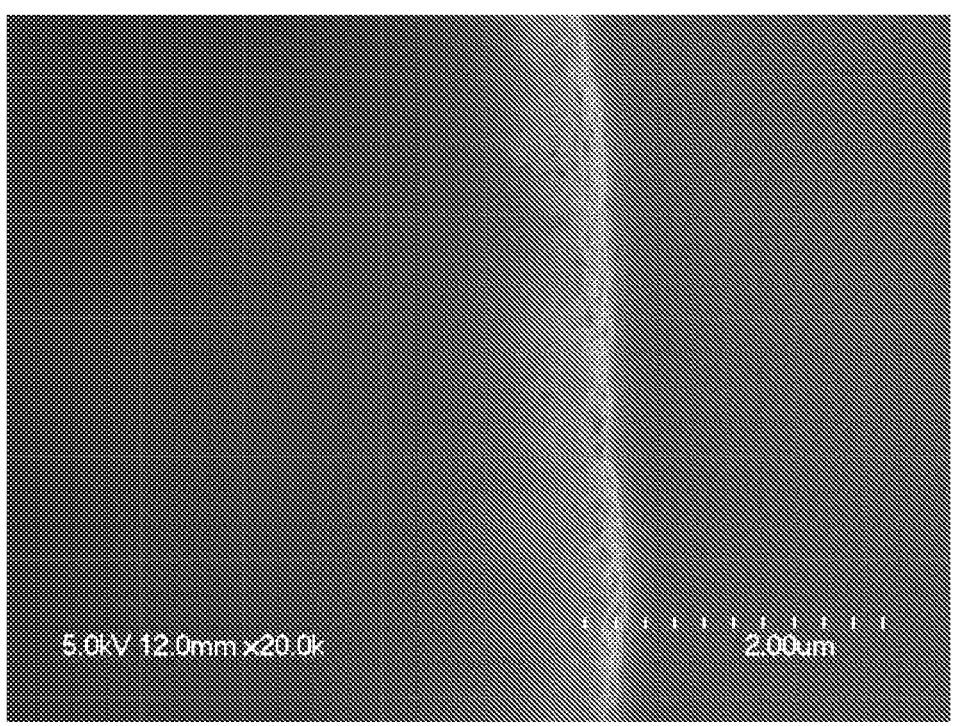
FIG. 11(b) is a microscope photograph in which an upper side surface of the taper etching structure of FIG. 11(a) is enlarged.

FIG. 11(a) is a microscope photograph showing the entire section of an etching structure formed when the supply flow rate of N2 gas was 100 sccm, and FIG. 11(b) is a microscope photograph in which a side wall of the formed etching structure is enlarged. The measurement result of the surface roughness in this figure was 75 nm, and the etching rate was 14.6 µm/min.

Figure 12A:
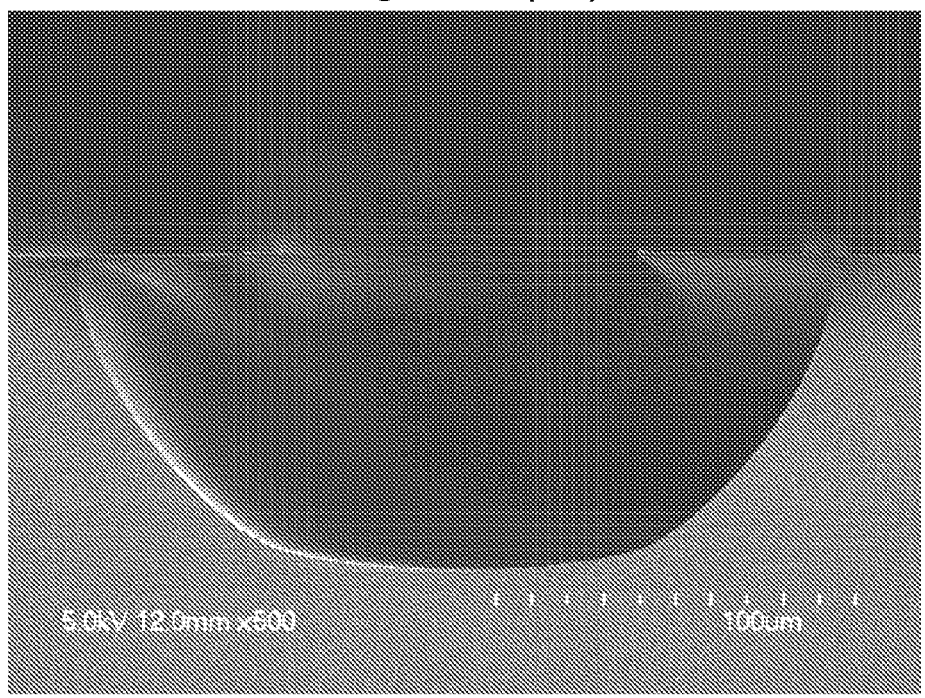
FIG. 12(a) is a microscope photograph showing the entire section of a taper etching structure in the experiment in which the flow rate of the supplied nitrogen gas is changed.
Figure 12B:
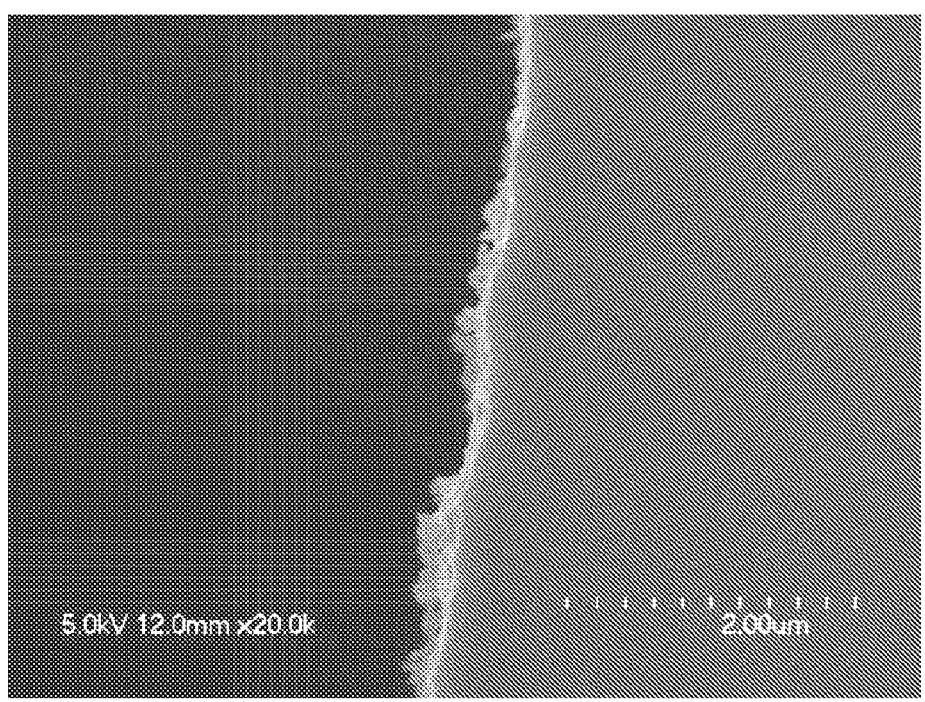
FIG. 12(b) is a microscope photograph in which an upper side surface of the taper etching structure of FIG. 12(a) is enlarged.

FIG. 12(a) is a microscope photograph showing the entire section of an etching structure formed when the supply flow rate of N2 gas was 200 sccm, and FIG. 12(b) is a microscope photograph in which a side wall of the formed etching structure is enlarged. The measurement result of the surface roughness in this figure was 71 nm, and the etching rate was 12.3 µm/min.

Figure 13A:
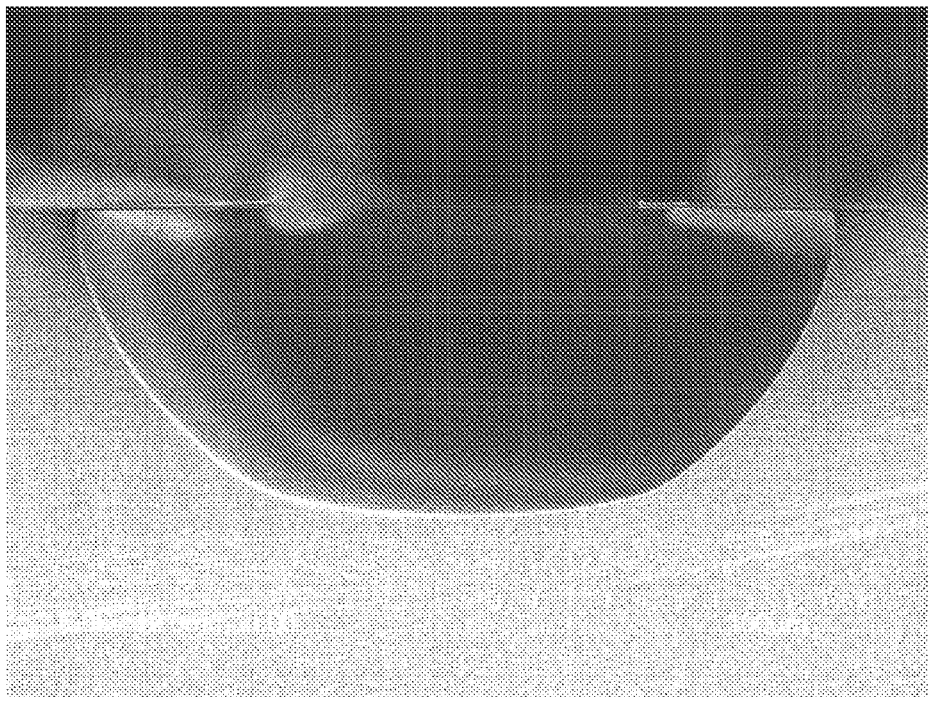
FIG. 13(a) is a microscope photograph showing the entire section of a taper etching structure in the experiment in which the flow rate of the supplied nitrogen gas is changed.
Figure 13B:
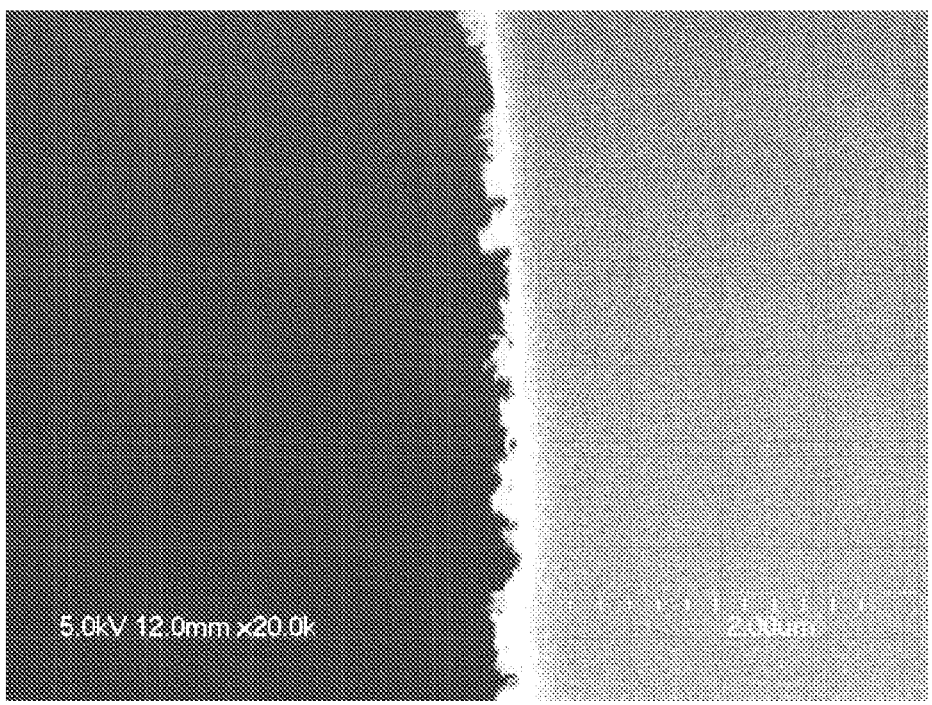
FIG. 13(b) is a microscope photograph in which an upper side surface of the taper etching structure of FIG. 13(a) is enlarged.

FIG. 13(a) is a microscope photograph showing the entire section of an etching structure formed when the supply flow rate of N2 gas was 300 sccm, and FIG. 13(b) is a microscope photograph in which a side wall of the formed etching structure is enlarged. The measurement result of the surface roughness in this figure was 54 nm, and the etching rate was 12.1 µm/min.

Figure 14A:
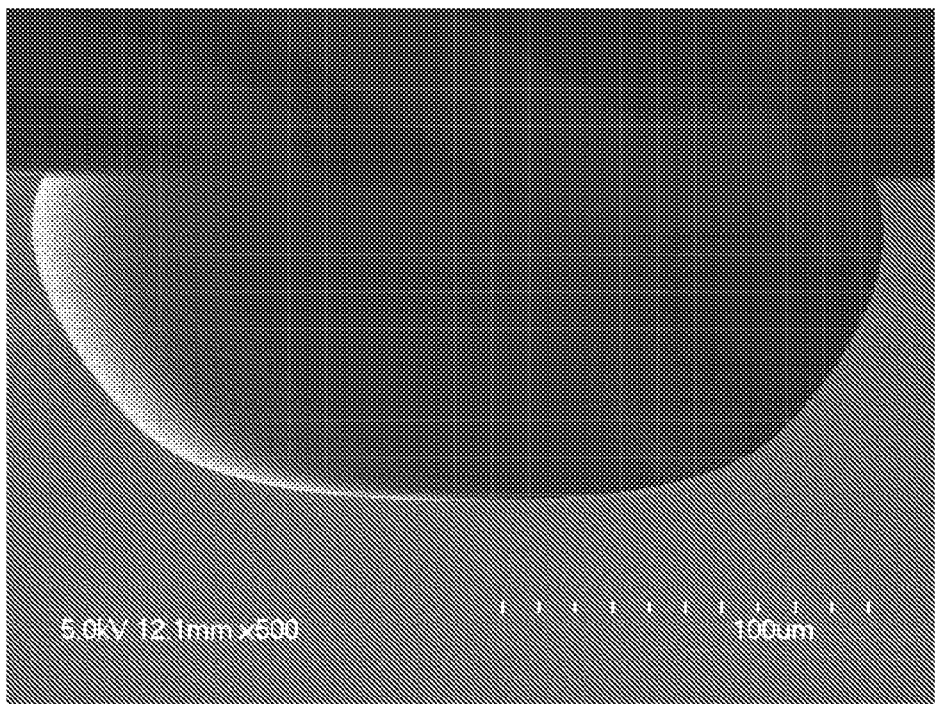
FIG. 14(a) is a microscope photograph showing the entire section of a taper etching structure in the experiment in which the flow rate of the supplied nitrogen gas is changed.
Figure 14B:
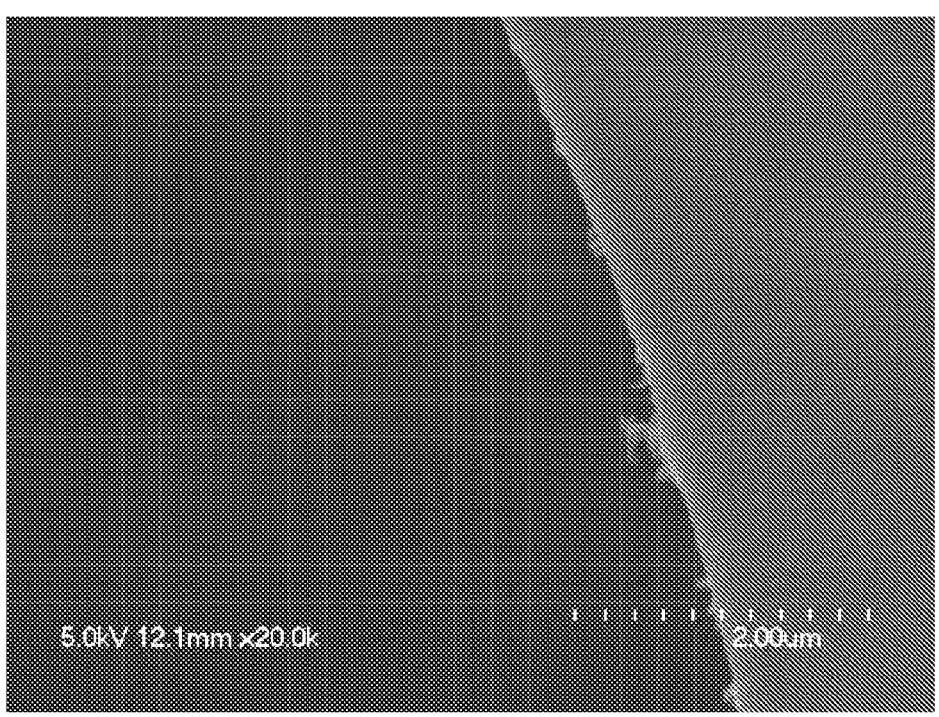
FIG. 14(b) is a microscope photograph in which an upper side surface of the taper etching structure of FIG. 14(a) is enlarged.

FIG. 14(a) is a microscope photograph showing the entire section of an etching structure formed when the supply flow rate of N2 gas was 400 sccm, and FIG. 14(b) is a microscope photograph in which a side wall of the formed etching structure is enlarged. The measurement result of the surface roughness in this figure was 60 nm, and the etching rate was 12.7 µm/min.

FIG. 15 shows a table of the experimental results of FIGS. 10 to 14. From FIG. 15, it is seen that the surface roughness is generally reduced as the supply flow rate of N2 gas is increased. This is considered to be caused by the fact that the protection of the side wall of the etching structure is performed by the formation of the etch-resistant layer by generating plasma from a larger amount of N2 gas. Adjusting the supply flow rate of N2 gas within a range of 100 to 400 sccm makes it possible to obtain a good value of the surface roughness which is equal to or less than half of that when the supply flow rate of N2 gas is 50 sccm, which is preferable. It is noted that the tendency that the etching rate is reduced as the supply flow rate of N2 gas is increased is considered to be caused by the fact that SF6 gas is diluted in the N2 gas.

3-2, Fourth Example

Next, as Example 4, the inventors carried out an experiment on how the taper state was changed by changing the chamber inner pressure at the time of N2 gas etching.

FIGS. 16 to 18 are microscope photographs showing how the state of the etching structure was changed when the chamber inner pressure at the time of N2 gas etching was gradually increased without changing other process conditions. The (a)s of FIGS. 16 to 18 are microscope photographs showing the entire sections of the formed etching structures, the (b)s thereof are microscope photographs in which an upper portion of their respective formed etching structures is enlarged, and the (c)s thereof are microscope photographs in which a bottom portion of their respective formed etching structures is enlarged.

The common process conditions of FIGS. 16 to 18 were as follows: the etching process time was 4 minutes; the platen temperature was 10° C.; the radio-frequency power supplied to the coils 31 was 2500 W; the power supplied to the platen 15 was 10 W; the supply flow rate of SF6 gas was 200 sccm; and the supply flow rate of N2 gas was 300 sccm. The inventors changed the pressure inside the processing chamber 11 within a range of 12 to 25 Pa.

Figure 16A:
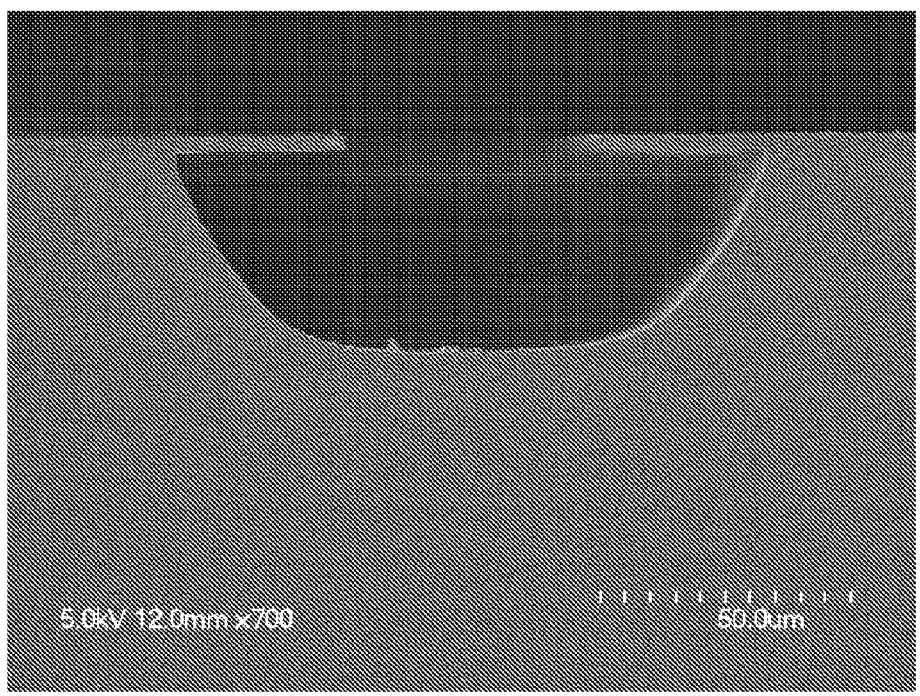
FIG. 16(a) is a microscope photograph showing the entire section of a taper etching structure in an experiment in which the chamber inner pressure is changed.
Figure 16B:
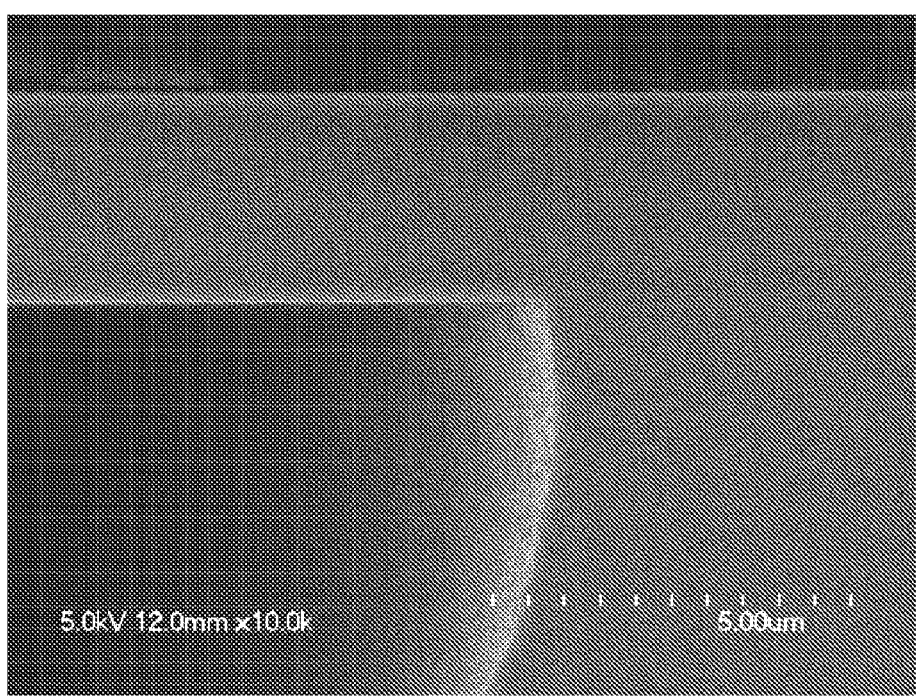
FIG. 16(b) is a microscope photograph in which an upper side surface of the taper etching structure of FIG. 16(a) is enlarged.
Figure 16C:
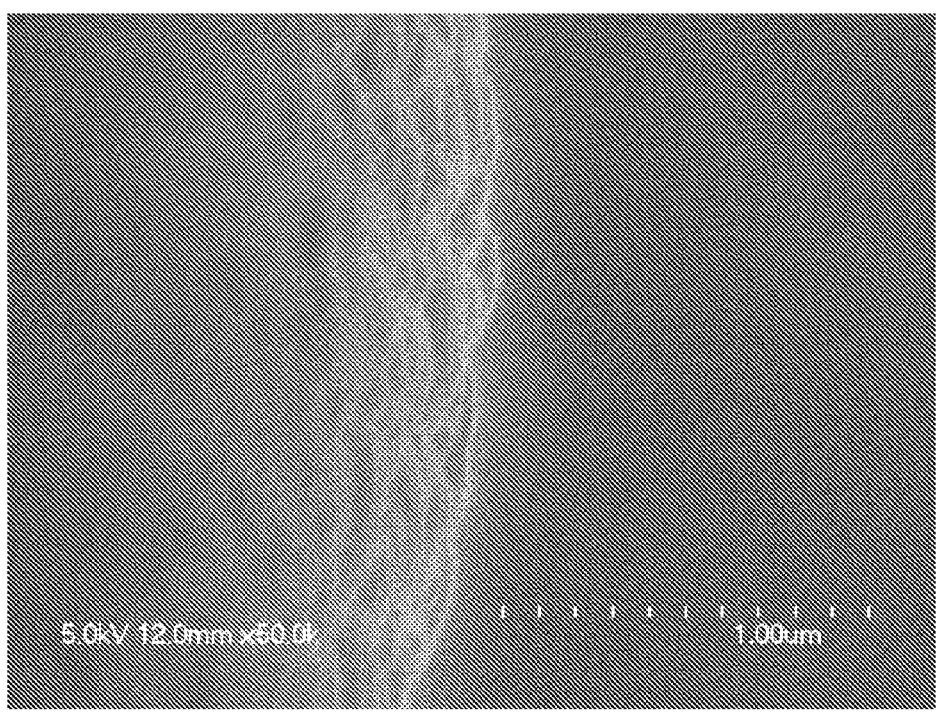
FIG. 16(c) is a microscope photograph in which the side surface of the taper etching structure of FIG. 16(b) is enlarged.

FIG. 16(a) is a microscope photograph showing the entire section of an etching structure formed when the pressure inside the processing chamber 11 was 12 Pa, FIG. 16(b) is a microscope photograph in which a side wall of the formed etching structure is enlarged, and FIG. 16(c) is a microscope photograph in which the side wall of FIG. 16(b) is further enlarged. The measurement result of the surface roughness in this figure was 44 nm, and the etching rate was 10.1 µm/min.

Figure 17A:
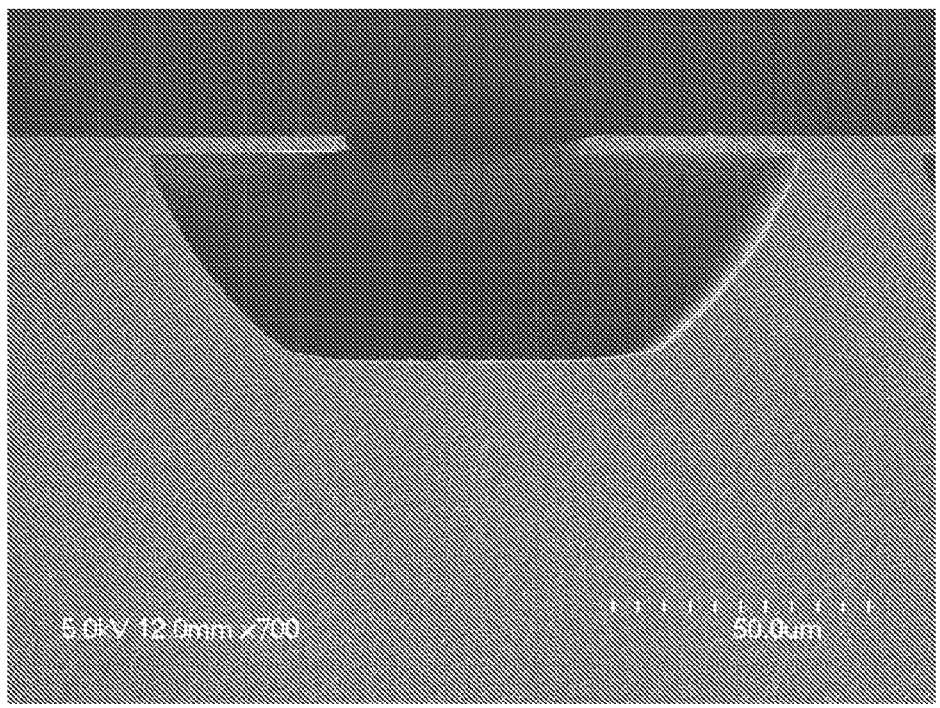
FIG. 17(a) is a microscope photograph showing the entire section of a taper etching structure in the experiment in which the chamber inner pressure is changed.
Figure 17B:
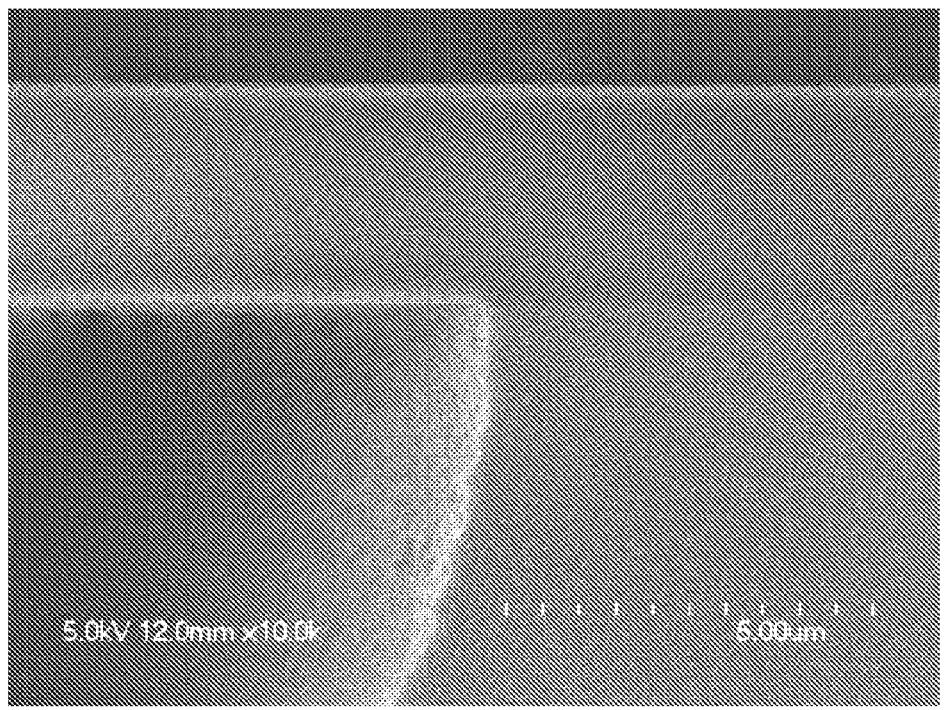
FIG. 17(b) is a microscope photograph in which an upper side surface of the taper etching structure of FIG. 17(a) is enlarged.
Figure 17C:
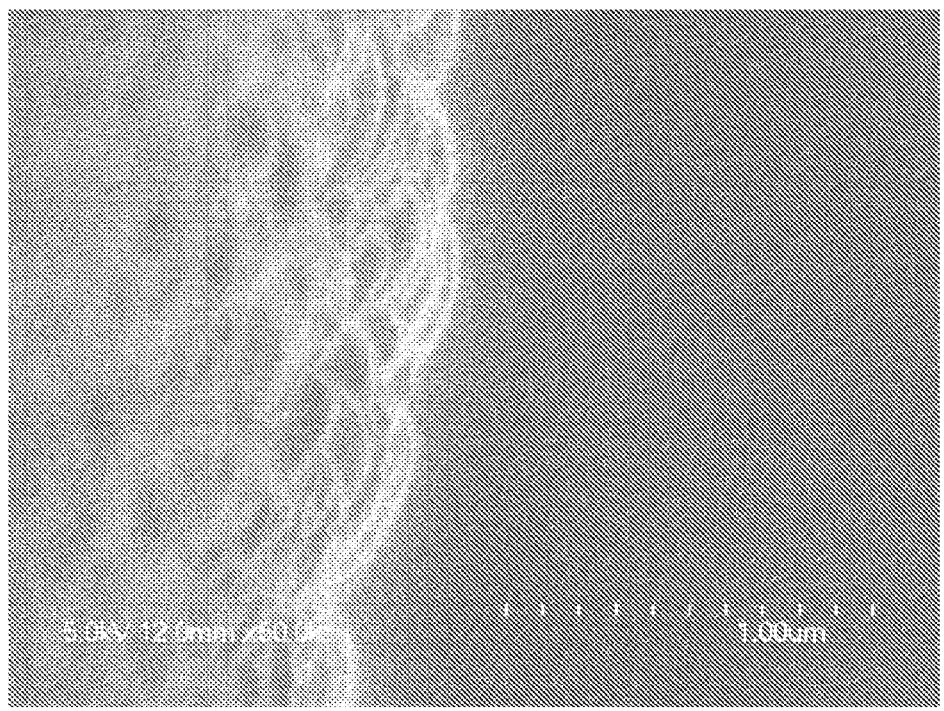
FIG. 17(c) is a microscope photograph in which the side surface of the taper etching structure of FIG. 17(b) is enlarged.

FIG. 17(a) is a microscope photograph showing the entire section of an etching structure formed when the pressure inside the processing chamber 11 was 16 Pa, FIG. 17(b) is a microscope photograph in which a side wall of the formed etching structure is enlarged, and FIG. 17(c) is a microscope photograph in which the side wall of FIG. 17(b) is further enlarged. The measurement result of the surface roughness in this figure was 67 nm, and the etching rate was 10.4 µm/min.

Figure 18A:
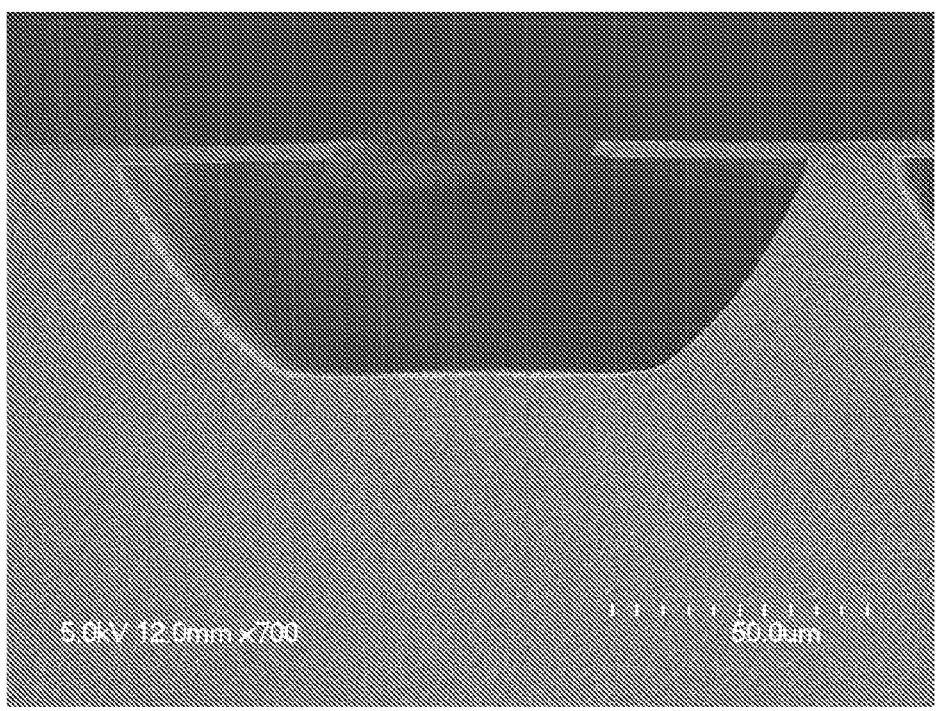
FIG. 18(a) is a microscope photograph showing the entire section of a taper etching structure in the experiment in which the chamber inner pressure is changed.
Figure 18B:
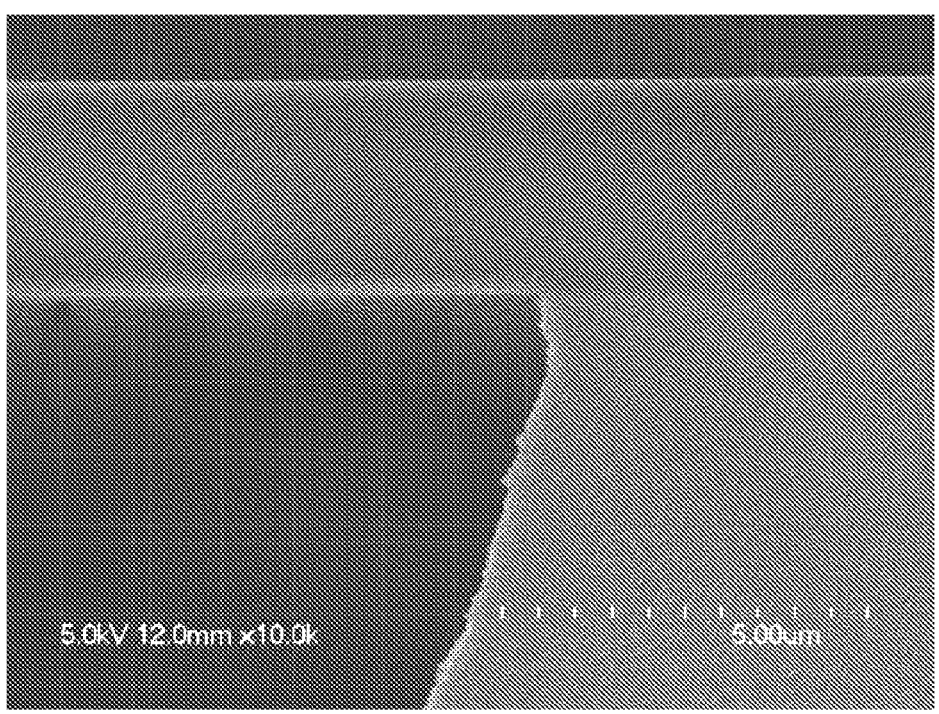
FIG. 18(b) is a microscope photograph in which an upper side surface of the taper etching structure of FIG. 18(a) is enlarged.
Figure 18C:
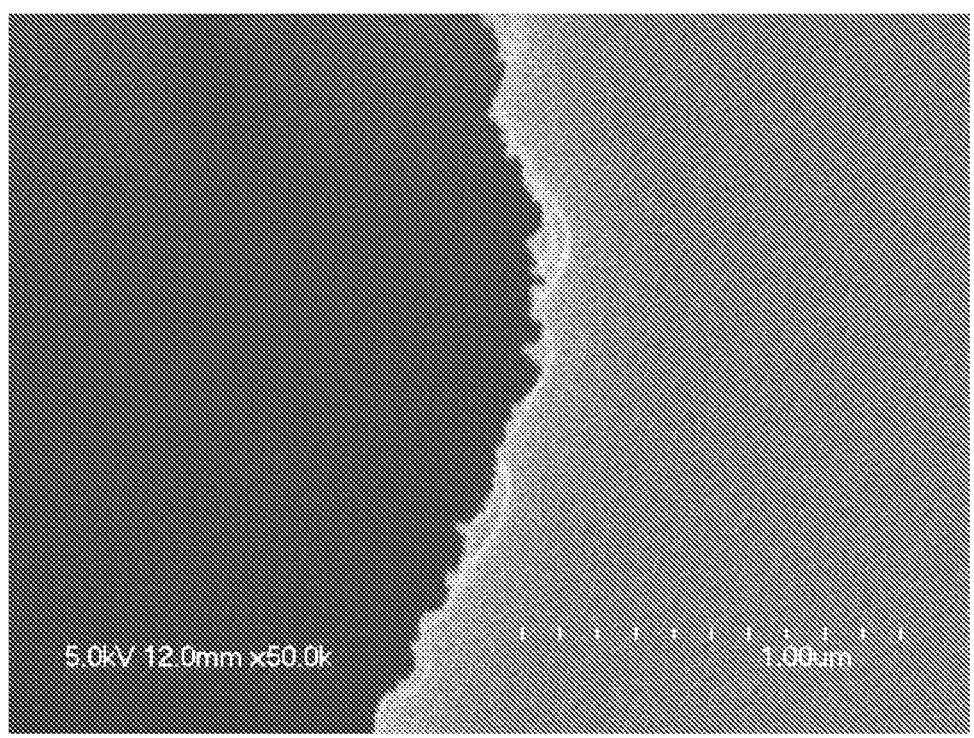
FIG. 18(c) is a microscope photograph in which the side surface of the taper etching structure of FIG. 18(b) is enlarged.

FIG. 18(a) is a microscope photograph showing the entire section of an etching structure formed when the pressure inside the processing chamber 11 was 25 Pa, FIG. 18(b) is a microscope photograph in which a side wall of the formed etching structure is enlarged, and FIG. 18(c) is a microscope photograph in which the side wall of FIG. 18(b) is further enlarged. The measurement result of the surface roughness in this figure was 83 nm, and the etching rate was 10.9 µm/min.

FIG. 19 shows a table of the experimental results of FIGS. 16 to 18. From FIG. 19, it is seen that, when the pressure inside the processing chamber 11 is changed from 12 Pa to 25 Pa, although the value of the surface roughness is increased as the pressure is increased, a relatively good surface roughness below 100 nm can be obtain at all the pressures.

Although it is difficult to directly read a fine taper shape from the microscope photographs of these figures, the taper shape becomes straighter as the chamber inner pressure is increased from FIG. 16 to FIG. 18. Therefore, this will be described below. As a premise therefor, a method of determining the taper angle is explained using FIG. 20.

Figure 20:
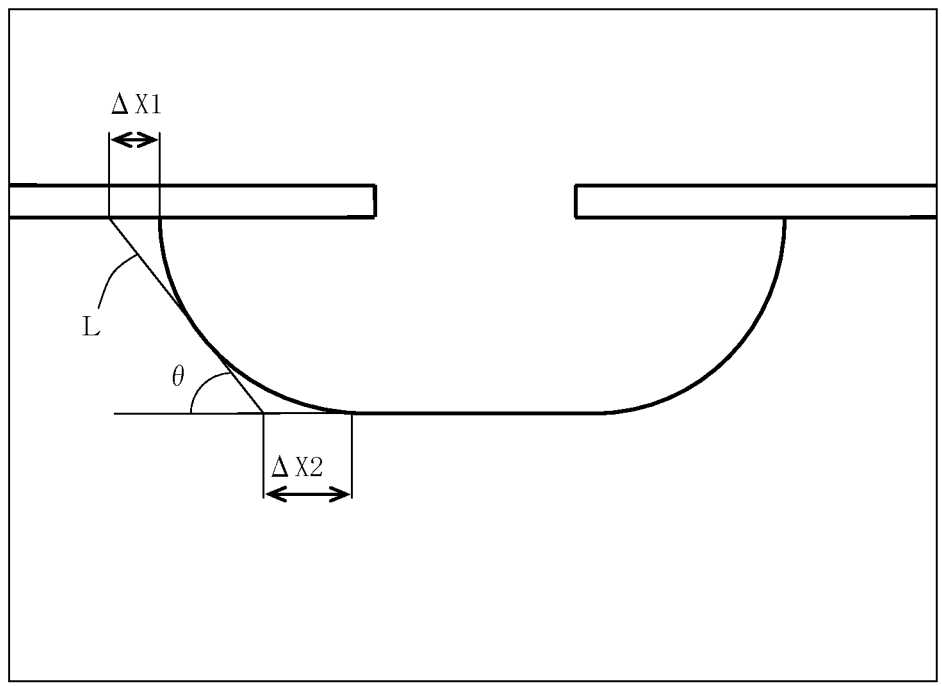
FIG. 20 is a schematic diagram for explaining a method of determining the taper angle in a section of a taper etching structure.

FIG. 20 is a schematic diagram showing a section of an etching structure (taper etching structure). As shown in FIG. 20, the side wall portion (taper portion) of an etching structure is generally in an arc shape. A tangential line L is drawn at the taper portion, and for each of the ends of the etching structure (two points; the upper end and the lower end, that is, the bottom), how far it is from the tangential line L is defined by $\Delta X$. The angle of the tangential line L is adjusted so that $\Delta X1$ of the upper end of the etching structure and $\Delta X2$ of the lower end (bottom) thereof become equal to each other, and the angle of the tangential line L with respect to the horizontal is designated as $\theta$ and this is defined as the tapered angle.

When inspecting the thus defined taper angle for FIGS. 16 to 18, it was 57.4 degrees ($\Delta x=11$ µm) in FIG. 16, 56.8 degrees ($\Delta x=8$ µm) in FIG. 17, and 54.1 degrees ($\Delta x=7$ µm) in FIG. 18. That is, it can be read that the distance from the tangential line L to the upper end and the lower end (bottom) of the etching structure becomes smaller as the chamber inner pressure is increased from FIG. 16 to FIG. 18.

The decrease of the taper angle $\theta$ as the increase of the chamber inner pressure from FIG. 16 to FIG. 18 is considered to be caused by the fact that, because etching proceeds in all directions due to the increase of the chamber inner pressure, the etching speed in the direction of the width of the etching structure is more increased relative to that in the depth direction.

It is noted that the taper in this specification includes all gradually narrowing shapes, such as a bowl shape, as long as it has a wide top opening width and a narrow bottom width, and a preferable taper angle varies depending on embodiment and purpose of use. In a process of manufacturing a semiconductor or the like, typically, a taper having a taper angle of about 50 to 60 degrees and being as straight as possible is preferred. Thus, in a case where a straight taper is preferred, in comparison between FIGS. 16 to 18, the taper of FIG. 18 which has a small value of $\Delta x$ and has a straighter shape is preferred.

3-3, Fifth Example

Next, as Example 5, the inventors carried out an experiment on how the taper state was changed when the power supplied to the platen 15 (platen power) was gradually increased at the time of N2 gas etching.

Figure 21A:
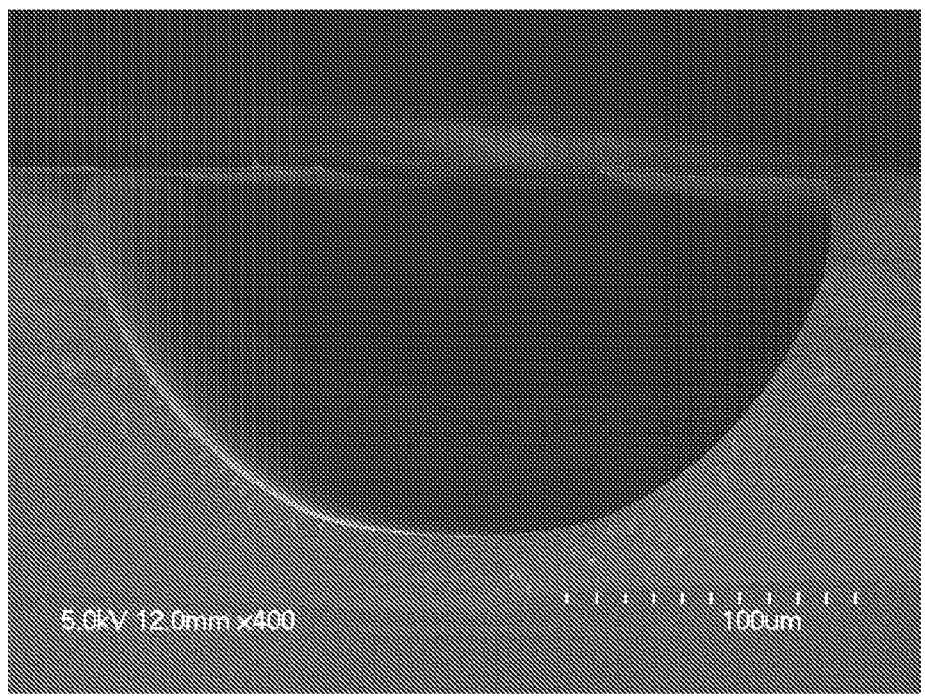
FIG. 21(a) is a microscope photograph showing the entire section of a taper etching structure in an experiment in which the platen power is changed.
Figure 21B:
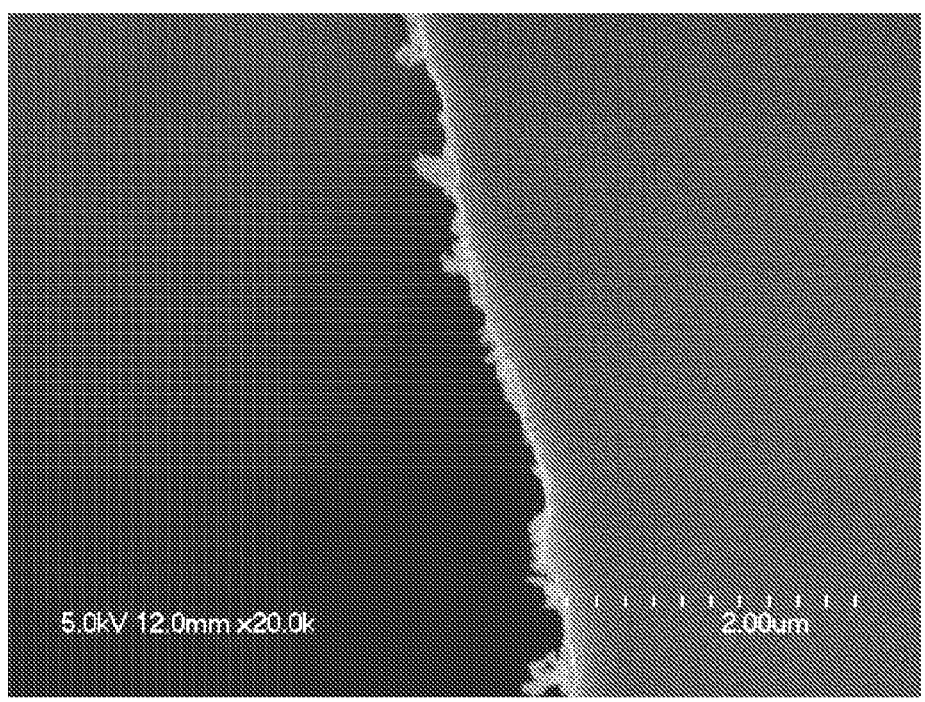
FIG. 21(b) is a microscope photograph in which a side surface of the taper etching structure of FIG. 21(a) is enlarged.
Figure 22A:
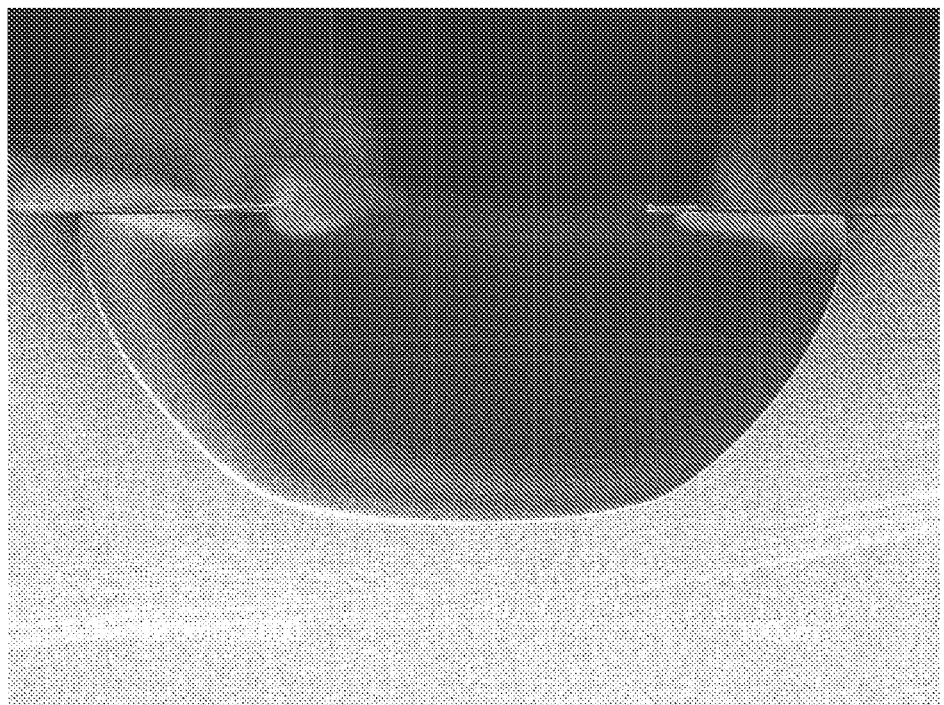
FIG. 22(a) is a microscope photograph showing the entire section of a taper etching structure in the experiment in which the platen power is changed.
Figure 22B:
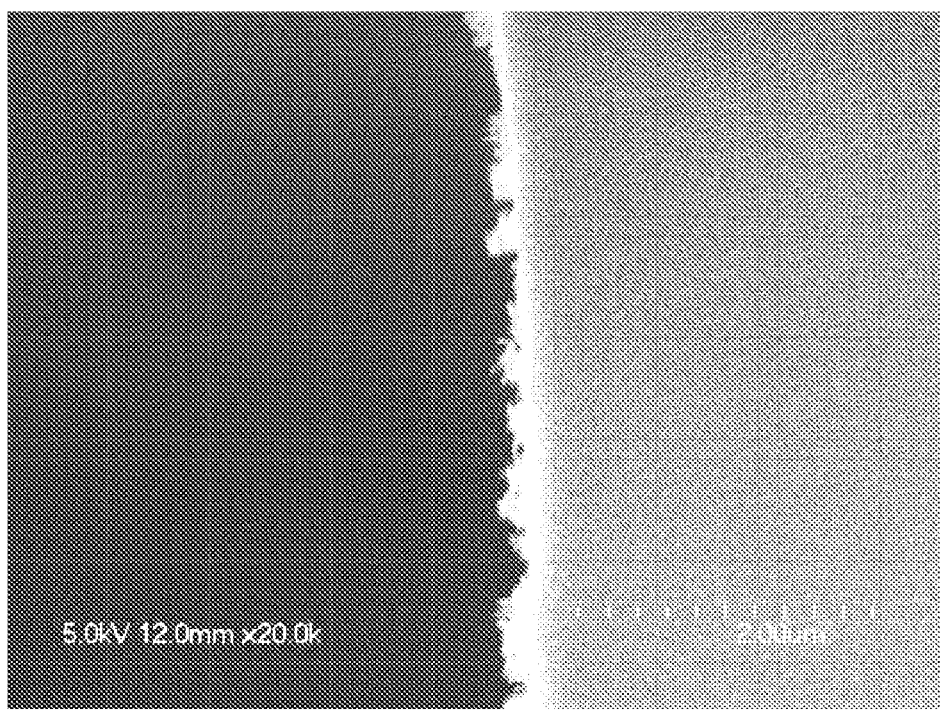
FIG. 22(b) is a microscope photograph in which a side surface of the taper etching structure of FIG. 22(a) is enlarged.
Figure 23A:
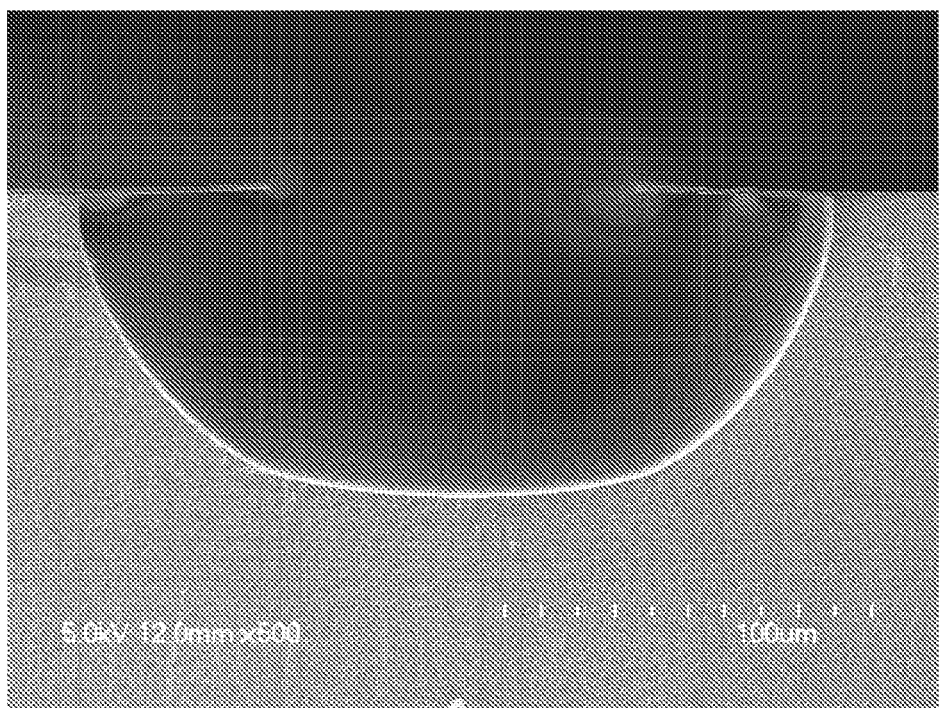
FIG. 23(a) is a microscope photograph showing the entire section of a taper etching structure in the experiment in which the platen power is changed.
Figure 23B:
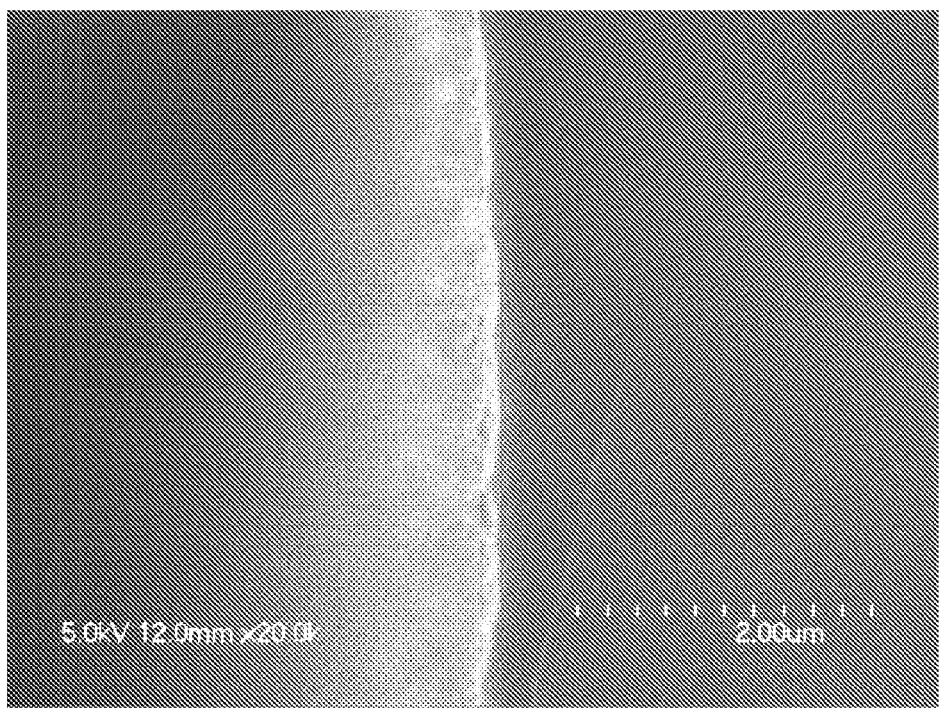
FIG. 23(b) is a microscope photograph in which a side surface of the taper etching structure of FIG. 23(a) is enlarged.

FIGS. 21 to 23 are microscope photographs showing how the state of the etching structure was changed when the power supplied to the platen 15 (platen power) was gradually increased without changing other process conditions. The (a)s of FIGS. 21 to 23 are microscope photographs showing the entire sections of the formed etching structures and the (b)s thereof are microscope photographs in which an upper portion of their respective formed etching structures is enlarged.

The common process conditions of FIGS. 21 to 23 were as follows: the etching process time was 7 minutes; the pressure inside the processing chamber 11 was 12 Pa; the platen temperature was 10° C.; the radio-frequency power supplied to the coils 31 was 2500 W; the supply flow rate of SF6 gas was 200 sccm; and the supply flow rate of N2 gas was 300 sccm. The inventors changed the power supplied to the platen 15 in a range of 30 to 70 W.

FIG. 21(*a*) is a microscope photograph showing the entire section of an etching structure formed when the power supplied to the platen 15 was 30 W, and FIG. 21(*b*) is a microscope photograph in which an upper side wall of the formed etching structure is enlarged. The measurement result of the surface roughness in this figure was 76 nm, and the etching rate was 18.0 μm/min.

FIG. 22(*a*) is a microscope photograph showing the entire section of an etching structure formed when the power supplied to the platen 15 was 50 W, and FIG. 22(*b*) is a microscope photograph in which an upper side wall of the formed etching structure is enlarged. The measurement result of the surface roughness in this figure was 54 nm, and the etching rate was 12.1 μm/min.

FIG. 23(*a*) is a microscope photograph showing the entire section of an etching structure formed when the power supplied to the platen 15 was 70 W, and FIG. 23(*b*) is a microscope photograph in which an upper side wall of the formed etching structure is enlarged. The measurement result of the surface roughness in this figure was 54 nm, and the etching rate was 12.0 μm/min.

FIG. 24 shows a table of the experimental results of FIGS. 21 to 23. Although the power supplied to the platen 15 (platen power) was 10 W in the experiment of the Example 4, it is seen that, as shown in FIGS. 21 to 23, a taper etching structure having a good surface roughness and a good shape can be obtained also in a range of 30 to 70 W like this Example.

As described above, the inventors, by the experiments, found that the state of the formed taper etching structure (including the shape and the surface roughness thereof) was greatly changed also depending on the flow rate of N2 gas and the pressure inside the reaction chamber. This means that adjusting these process conditions at the time of etching using N2 gas made it possible to control the taper state.

Thus, one embodiment of the present invention has been described. However, a specific embodiment in which the present invention can be implemented is not limited thereto.

In the above embodiment, the first etching step and the second etching step are performed successively. However, the execution of the etching steps is not limited thereto, and, when the etching structure to be formed has a shallow depth, it is possible to perform only the first etching step and omit the second etching step.

Further, in the above embodiment, process conditions appropriate to adjustment at the time of N2 gas etching, such as the flow rate of N2 gas and the pressure in the reaction chamber, are indicated. However, the process condition to be adjusted is not limited thereto and may be the platen power, another process condition, or an arbitrary combination of several process conditions.

Furthermore, although the plasma etching method of the present invention has been performed using the etching apparatus 1, an etching apparatus having another configuration may be used for performing this plasma etching method.

What is claimed is:

1. A plasma etching method in which plasma is generated from a processing gas and a silicon substrate is etched to form a tapering etching structure having a wide top opening width and a narrow bottom width in the silicon substrate, the method comprising:
   a first step in which a first processing gas comprising a fluorine-containing gas and $N_2$ gas but absent $O_2$ gas is used to generate plasma, wherein plasma generated by the fluorine-containing gas etches a first portion of the tapering etching structure into the silicon substrate while plasma generated by the $N_2$ gas forms a first etch-resistant layer on the silicon substrate; and
   a second step, subsequent to the first step, in which a second processing gas comprising a fluorine-containing gas and an oxygen-containing gas is used to generate plasma, wherein plasma generated by the fluorine-containing gas etches a second portion of the tapering etching structure into the silicon substrate while plasma generated by the oxygen-containing gas forms a second etch-resistant layer on the silicon substrate.

2. The plasma etching method according to claim 1, in which the tapering etching structure comprises a taper shape and a surface roughness of a tapering region, and in which at least one of the taper shape and the surface roughness of the tapering region is controlled by adjusting a supply flow rate of the $N_2$ gas during the first step.

3. The plasma etching method according to claim 2, in which the supply flow rate of the $N_2$ gas is within a range of 100 to 400 sccm.

4. The plasma etching method according to claim 1, in which the tapering etching structure comprises a taper shape and a surface roughness of a tapering region, and in which at least one of the taper shape and the surface roughness of the tapering region is controlled by adjusting a chamber inner pressure during at least one of the first and second steps.

5. The plasma etching method according to claim 4, in which the chamber inner pressure is within a range of 12 to 25 Pa.

6. The plasma etching method according to claim 1, in which a process time of the first step is set in a range of 4 to 10 seconds.

7. The plasma etching method according to claim 1, in which the fluorine-containing gas of at least one of the first and second processing gases comprises one of $SF_6$ gas and $CF_4$ gas.

8. The plasma etching method according to claim 1, in which the oxygen-containing gas comprises $O_2$ gas.

* * * * *